(12) United States Patent
Wang et al.

(10) Patent No.: US 11,816,030 B2
(45) Date of Patent: Nov. 14, 2023

(54) MEMORY DEVICE AND OPERATING METHOD THEREOF

(71) Applicant: MACRONIX INTERNATIONAL CO., LTD., Hsinchu (TW)

(72) Inventors: Yun-Yuan Wang, Kaohsiung (TW); Cheng-Hsien Lu, Taoyuan (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 43 days.

(21) Appl. No.: 17/722,420

(22) Filed: Apr. 18, 2022

(65) Prior Publication Data
US 2023/0236967 A1 Jul. 27, 2023

Related U.S. Application Data

(60) Provisional application No. 63/302,550, filed on Jan. 24, 2022.

(51) Int. Cl.
*G06F 12/06* (2006.01)
*G11C 8/08* (2006.01)
*G11C 7/12* (2006.01)
*H03K 19/20* (2006.01)

(52) U.S. Cl.
CPC .......... *G06F 12/0646* (2013.01); *G11C 7/12* (2013.01); *G11C 8/08* (2013.01); *G06F 2212/251* (2013.01); *H03K 19/20* (2013.01)

(58) Field of Classification Search
CPC . G06F 12/0646; G06F 2212/251; G11C 7/12; G11C 8/08; H03K 19/20
USPC ........................................................ 711/200
See application file for complete search history.

(56) References Cited

U.S. PATENT DOCUMENTS

| | | | | |
|---|---|---|---|---|
| 2014/0136755 A1* | 5/2014 | Hyde | ................. | G06F 15/7814 711/103 |
| 2016/0028544 A1* | 1/2016 | Hyde | .................. | H04L 9/0662 711/112 |
| 2020/0401738 A1* | 12/2020 | Tamura | .................... | G06N 5/01 |
| 2021/0216608 A1* | 7/2021 | Koyama | ................ | G06F 30/20 |
| 2021/0382960 A1* | 12/2021 | Parizy | .................... | G06N 10/00 |

* cited by examiner

*Primary Examiner* — Than Nguyen
(74) *Attorney, Agent, or Firm* — McClure, Qualey & Rodack, LLP

(57) ABSTRACT

A memory device, for executing an anneal computation with first state and a second state. The memory device includes a first memory array, a second memory array, a control circuit, a sensing circuit and a processing circuit. the control circuit selects a first horizontal row of memory units from the first memory array, and selects a second horizontal row of memory units from the second memory array. The sensing circuit computes a local energy value of the first state according to the current generated by the memory units of the first horizontal row, and computes a local energy value of the second state according to the current generated by the memory units of the second horizontal row. The processing circuit updates the first state and/or the second state according to the local energy value of the first state and the local energy value of the second state.

20 Claims, 21 Drawing Sheets

MEMORY DEVICE AND OPERATING METHOD THEREOF

This application claims the benefit of U.S. provisional application Ser. No. 63/302,550, filed Jan. 24, 2022, the subject matter of which is incorporated herein by reference.

TECHNICAL FIELD

The present disclosure relates to a semiconductor device and an operating method thereof, and more particularly, to a memory device for performing an anneal computation and an operating method thereof.

BACKGROUND

An Ising model with multiple spin states may be used to perform an anneal computation. The Ising model may be applied to the traveling salesman problem (TSP) to obtain an optimal solution with the minimum travel distance. When the temperature of the anneal computation of the Ising model decreases and reaches the minimum energy value of the Ising model, the optimal solution of the configuration of the spin states may be obtained.

For a fully-connected Ising model, the anneal computation of the Ising model may be performed in a parallel manner, which may more quickly reach the minimum energy value of the Ising model. During the anneal computation, the spin state needs to be updated. However, when the dimension of the Ising model is larger and has a larger amount of spin states, it takes a lot of computing resources and a long computing time. Furthermore, defects in the hardware device executing the Ising model also lead to computational errors in the anneal computation.

Therefore, skilled ones in the related industries of the technical field are devoted to improve the hardware device for executing the Ising model and its operating method, expecting to enhance the speed of the anneal computation in a manner of parallel computation, and achieve a higher tolerance for defects in the hardware device.

SUMMARY

According to one aspect of the present disclosure, a memory device is provided. The memory device is for executing an anneal computation, the anneal computation has a first state and a second state the memory device comprises a first memory array, a second memory array, a control circuit, at least a sensing circuit and at least a processing circuit. The first memory array comprises a plurality of memory units arranged in a plurality of vertical columns and a plurality of horizontal rows. The second memory array comprises a plurality of memory units arranged in a plurality of vertical columns and a plurality of horizontal rows. The control circuit is configured to select a plurality of memory units of a first horizontal row from a first memory array, and select a plurality of memory units of a second horizontal row from a second memory array. The sensing circuit is configured to calculate a local energy value of the first state according to currents generated by the memory units of the first horizontal row, and calculate a local energy value of the second state according to currents generated by the memory units of the second horizontal row. The processing circuit is configured to update the first state and/or update the second state according to the local energy value of the first state and the local energy value of the second state.

According to another aspect of the present disclosure, a memory device is provided. The memory device is for executing an anneal computation, the anneal computation has a first state and a second state the memory device comprises a first memory array, a second memory array, a control circuit, at least a sensing circuit and at least a processing circuit. The first memory array comprises a plurality of memory units arranged in a plurality of vertical columns and a plurality of horizontal rows. The second memory array comprises a plurality of memory units arranged in a plurality of vertical columns and a plurality of horizontal rows. The control circuit is configured to select a plurality of memory units of a first vertical column from a first memory array, and select a plurality of memory units of a second vertical column from a second memory array. The sensing circuit is configured to calculate a local energy value of the first state according to currents generated by the memory units of the first vertical column, and calculate a local energy value of the second state according to currents generated by the memory units of the second vertical column. The processing circuit is configured to update the first state and/or update the second state according to the local energy value of the first state and the local energy value of the second state.

According to still another aspect of the present disclosure, an operating method for a memory device is provided. Wherein the memory device is for executing an anneal computation, the anneal computation has a first state and a second state, the memory device comprises a first memory array and a second memory array. The operating method comprises the following steps. Selecting a plurality of memory units of a first horizontal row or a first vertical column from a first memory array. Calculating a local energy value of the first state according to currents generated by the memory units of the first horizontal row or the first vertical column. Selecting a plurality of memory units of a second horizontal row or a second vertical column from a second memory array. Calculating a local energy value of the second state according to currents generated by the memory units of the second horizontal row or the second vertical column. Updating the first state and/or updating the second state according to the local energy value of the first state and the local energy value of the second state.

Figure 1A:
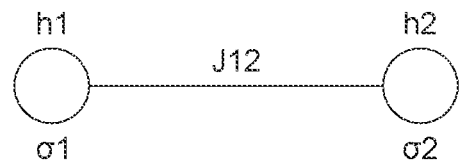
FIGS. 1A to 1D are schematic diagrams of performing anneal computations using spin states.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIGS. 1A to 1D are schematic diagrams of performing anneal computations using spin states. First, referring to FIG. 1A, the energy value of the spin energy of the spin state in the magnetic material may be described as an Ising model. A Ising model system may have a plurality of spin states, e.g., two spin states: state $\sigma1$ and state $\sigma2$. The numerical values of aforementioned states $\sigma1$ and $\sigma2$ may be "+1" or "−1". The Ising model system also has a mutual-coefficient Jij and a self-coefficient hi. According to the states $\sigma1$, $\sigma2$ and the coefficients Jij and hi, the total energy value E of the Ising model system may be calculated, as shown in equation (1):

$$E = \Sigma_{i \neq j} Jij\sigma i \sigma j + \Sigma_i hi\sigma i = J12\sigma1\sigma2 + h1\sigma1 + h2\sigma2 \quad (1)$$

Figure 1B:
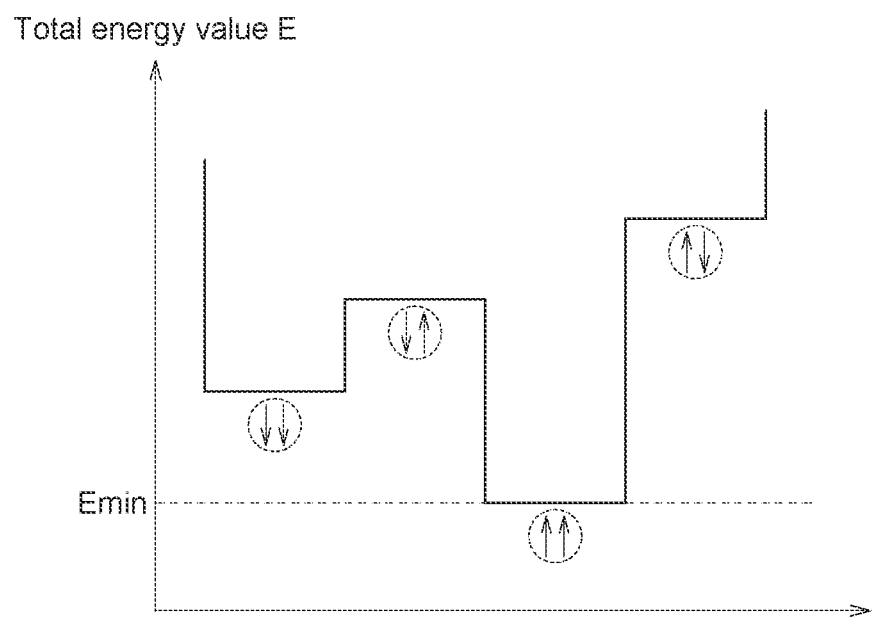

According to equation (1), different total energy values E may be obtained for different numeric values of states $\sigma1$ and $\sigma2$ of. Referring to FIG. 1B, when the states $\sigma1$ and $\sigma2$ are both "+1" (represented by the "upward arrow"), the minimum value Emin of the total energy value E may be obtained. That is, when the states $\sigma1$ and $\sigma2$ are both "+1", the Ising model system has an optimal solution.

Figure 1C:
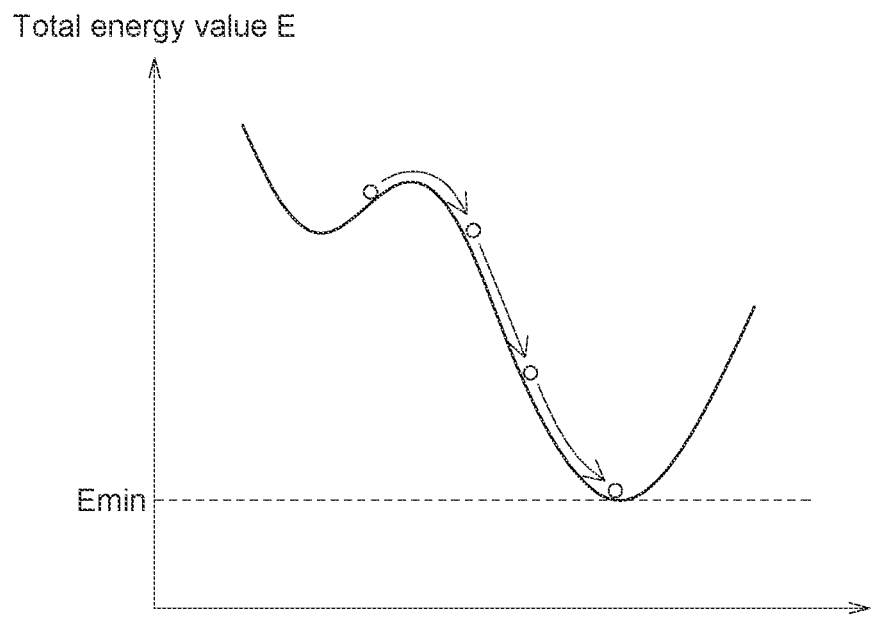
Figure 1D:
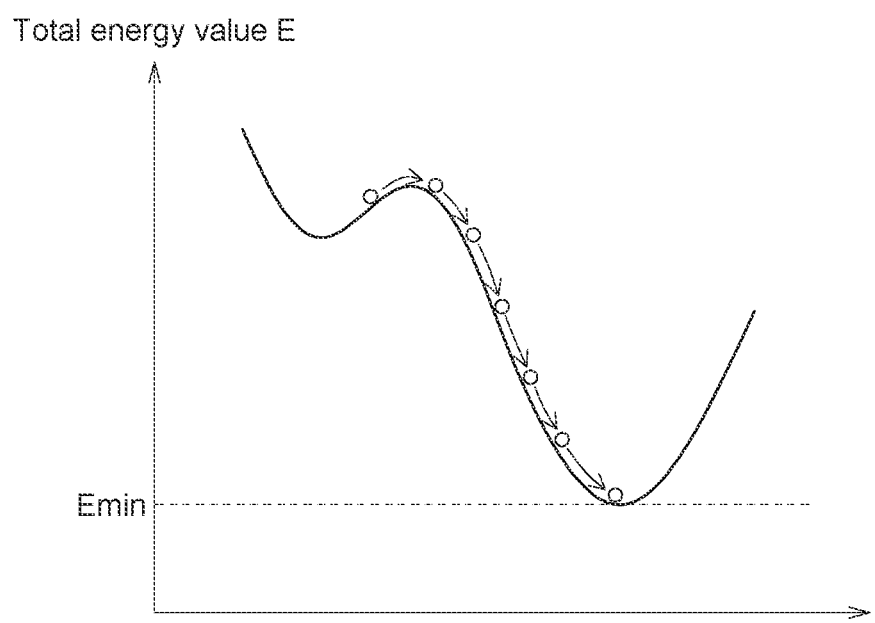

The total energy value E of equation (1) includes two components: the local energy value L1 of the local field of the state $\sigma1$ and the local energy value L2 of the local field of the state $\sigma2$. For a fully-connected Ising model, the local energy value L1 and the local energy value L2 may be calculated in parallel in the same operation cycle, and the states $\sigma1$ and $\sigma2$ may be parallel updated at the same time. Referring to FIG. 1C, when two states $\sigma1$ and $\sigma2$ (or more states $\sigma3$-$\sigma N$) are simultaneously updated in a parallel manner, the minimum value Emin of the total energy value E may be located more quickly. On the other hand, in the example of FIG. 1D, if only a single state is updated in the same operation cycle, it will take more operation time to locate the minimum value Emin of the total energy value E.

Figure 2:
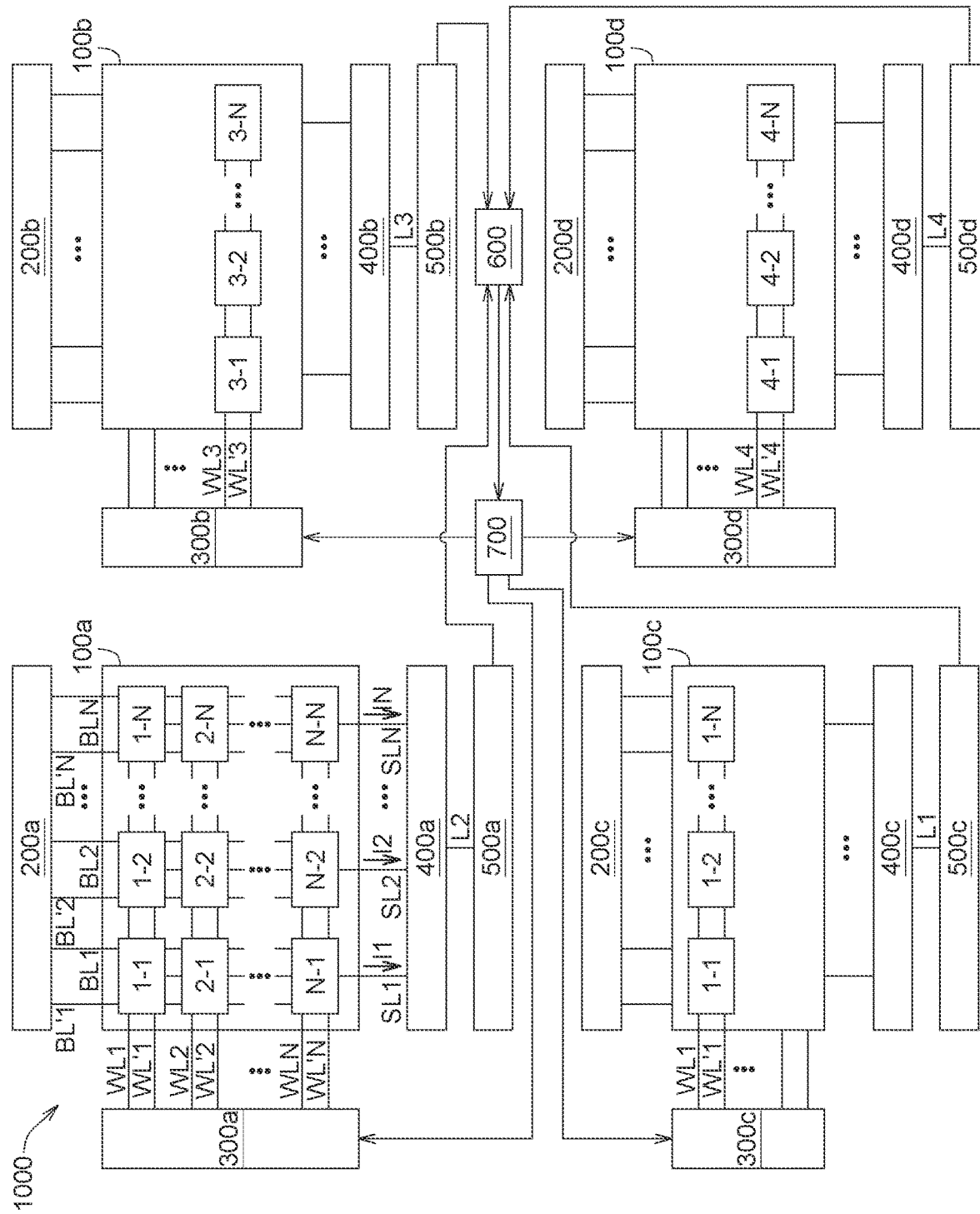
FIG. 2 is a schematic diagram of a memory device according to an embodiment of the present disclosure.

FIG. 2 is a schematic diagram of a memory device 1000 according to an embodiment of the present disclosure. The memory device 1000 includes a plurality of memory arrays, and FIG. 2 only exemplarily shows four memory arrays 100a-100d. These memory arrays 100a-100d are respectively connected to bit line (BL) driving circuits 200a-200d, word line (WL) driving circuits 300a-300d, sensing circuits 400a-400d and processing circuits 500a-500d. In addition, the processing circuits 500a-500d are commonly connected to a state register 600, and the word line driving circuits 300a-300d are commonly connected to a control circuit 700.

Each of the memory arrays 100a-100d includes a plurality of memory units. Taking the memory array 100a as an example, the memory array 100a includes memory units 1-1 to N-N, which are arranged in N horizontal rows and N vertical columns. That is, the memory array 100a is an N×N-square-matrix, which includes N×N memory units 1-1 to N-N. The memory units 1-1 to 1-N arranged in the first horizontal row are connected to the first word line WL1 and the first inverse word line WL'1, and the memory units 2-1 to 2-N arranged in the second horizontal row are connected to the second word line WL2 and the second inverse word line WL'2. Similarly, the memory units N-1 to N-N arranged in the N-th horizontal row are connected to the N-th word line WLN and the N-th inverse word line WL'N. The above-mentioned word lines WL1-WLN and the corresponding inverse word lines WL'1-WL'N are connected to the word line driving circuit 300a.

On the other hand, the memory units 1-1 to N-1 arranged in the first vertical column are connected to the first bit line BL1 and the first inverse bit line BL'1, and the memory units 1-2 to N-2 arranged in the second vertical column are connected to the second bit line BL2 and the second inverse bit line BL'2. Similarly, the memory units 1-N to N-N arranged in the N-th vertical column are connected to the N-th bit line BLN and the N-th inverse bit line BL'N. The above-mentioned bit lines BL1-BLN and corresponding inverse bit lines BL'1-BL'N are connected to the bit line driving circuit 200a.

In the operation of the memory array 100a, the word line driving circuit 300a may apply voltages to the corresponding memory units through the word lines WL1-WLN and the inverse word lines WL'1-WL'N, and the bit line driving circuit 200a may also apply voltages to the corresponding memory units through the bit lines BL1-BLN and the inverse word lines BL'1-BL'N. The voltages applied to the word lines WL1-WLN, the inverse word lines WL'1-WL'N, the bit lines BL1-BLN and the inverse bit lines BL'1-BL'N may correspond to the states $\sigma1$-$\sigma N$ of the Ising model. That is, the memory array 100a may be used to calculate the energy of an Ising model with N states $\sigma1$-$\sigma N$.

In this embodiment, the memory array 100a does not immediately calculate the total energy value E of the states $\sigma1$-$\sigma N$. Within one operation cycle, the memory array 100a only calculates the local energy value Li of the local field of one state $\sigma i$. For example, in the first operation cycle T1, the control circuit 700 may select the memory units 2-1 to 2-N in the second horizontal row of the memory array 100a. The selected memory units 2-1 to 2-N are used to calculate the local energy value L2 of the local field of the state $\sigma2$. Voltages (such voltages correspond to state $\sigma2$) may be applied to memory units 2-1 to 2-N through word line WL2 and inverse word line WL'2, and voltages (such voltages correspond to states $\sigma1$-$\sigma N$) may be respectively applied to memory units 2-1 to 2-N through bit lines BL1-BLN and inverse bit line BL'1-BL'N. In response to the applied voltages, the memory units 2-1 to 2-N in the second horizontal row may generate currents I1-IN, and output currents I1-IN through corresponding source lines SL1-SLN respectively. The sensing circuit 400a may receive the currents I1-IN, and perform summing and/or weighting processing according to the currents I1-IN to obtain the local energy value L2 of the state $\sigma2$. Furthermore, the processing circuit 500a may update the states $\sigma1$-$\sigma N$ according to the local energy value L2. The update manner is, for example, "flip". For example, the numeric value of the state σi is flipped from "+1" to "−1", or from "−1" to "+1". The updated states σ1-σN may be stored in the state register 600.

On the other hand, in the first operation cycle T1, the control circuit 700 selects memory units in different horizontal rows in the memory arrays 100b, 100c and 100d respectively. For example, the control circuit 700 selects the memory units 3-1 to 3-N of the third horizontal row of the memory array 100b, selects the memory units 1-1 to 1-N of the first horizontal row of the memory array 100c, and selects the memory units 4-1 to 4-N of the fourth horizontal row of the memory array 100d. The selected memory units 3-1 to 3-N are used to calculate the local energy value L3 of the state σ3, the selected memory units 1-1 to 1-N are used to calculate the local energy value L1 of the state σ1, the selected memory units 4-1 to 4-N are used to calculate the local energy value L4 of the state σ4.

In the operation of the memory array 100b, a voltage may be applied to the memory units 3-1 to 3-N through the word line WL3 and the inverse word line WL'3, and the applied voltage corresponds to the state σ3. The correspondingly generated currents of the memory units 3-1 to 3-N are transmitted to the sensing circuit 400, and the sensing circuit 400 obtains the local energy value L3 of the state σ3 accordingly. Furthermore, the processing circuit 500b updates the states σ1-σN, and the updated states σ1-σN are stored in the state register 600. Similarly, in the operation of the memory array 100c, the voltage corresponding to the state σ1 may be applied to the memory units 1-1 to 1-N through the word line WL1 and the inverse word line WL'1, and the sensing circuit 400c may calculate the local energy value L1 of the state σ1 according to the current generated by the memory units 1-1 to 1-N. The memory array 100d performs similar operations to the memory units 4-1 to 4-N through the word line WL4 and the inverse word line WL'4.

Figure 3A:
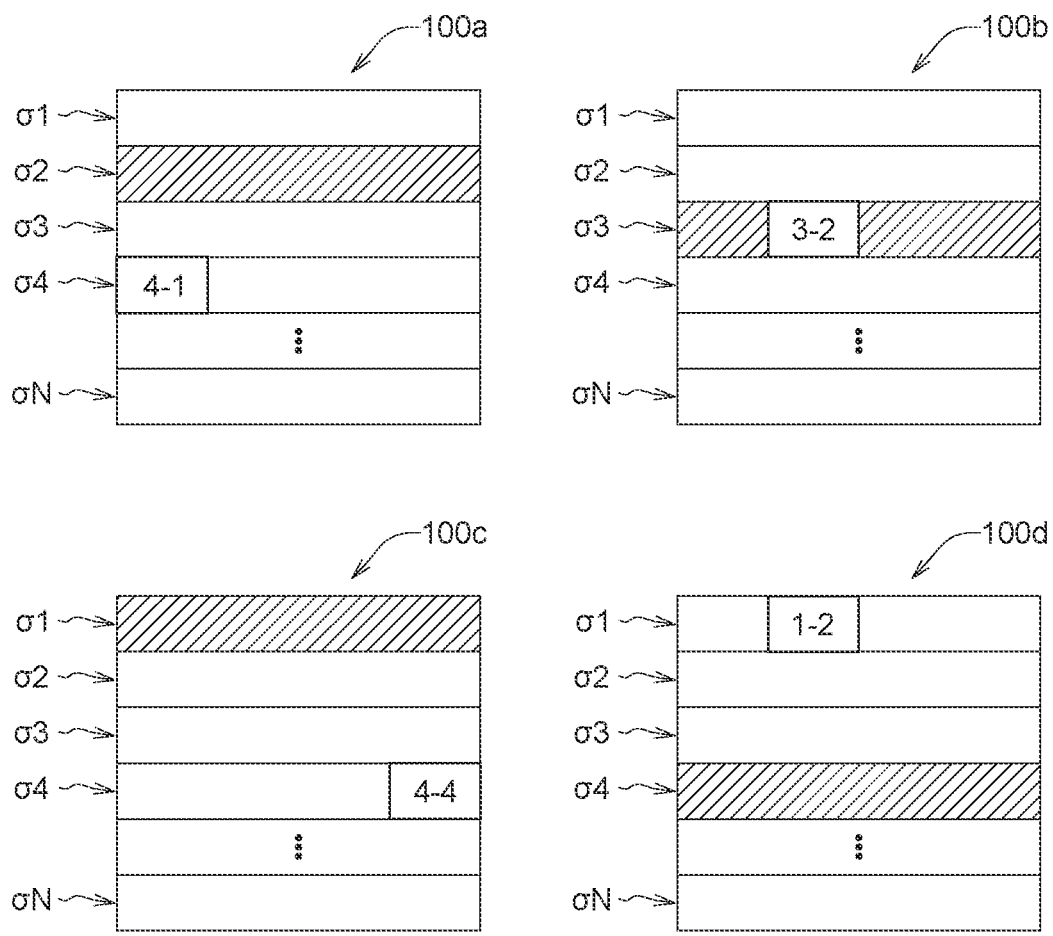
FIGS. 3A and 3B are schematic diagrams illustrating calculation for local energy value performed by the memory device of FIG. 2.
Figure 3B:
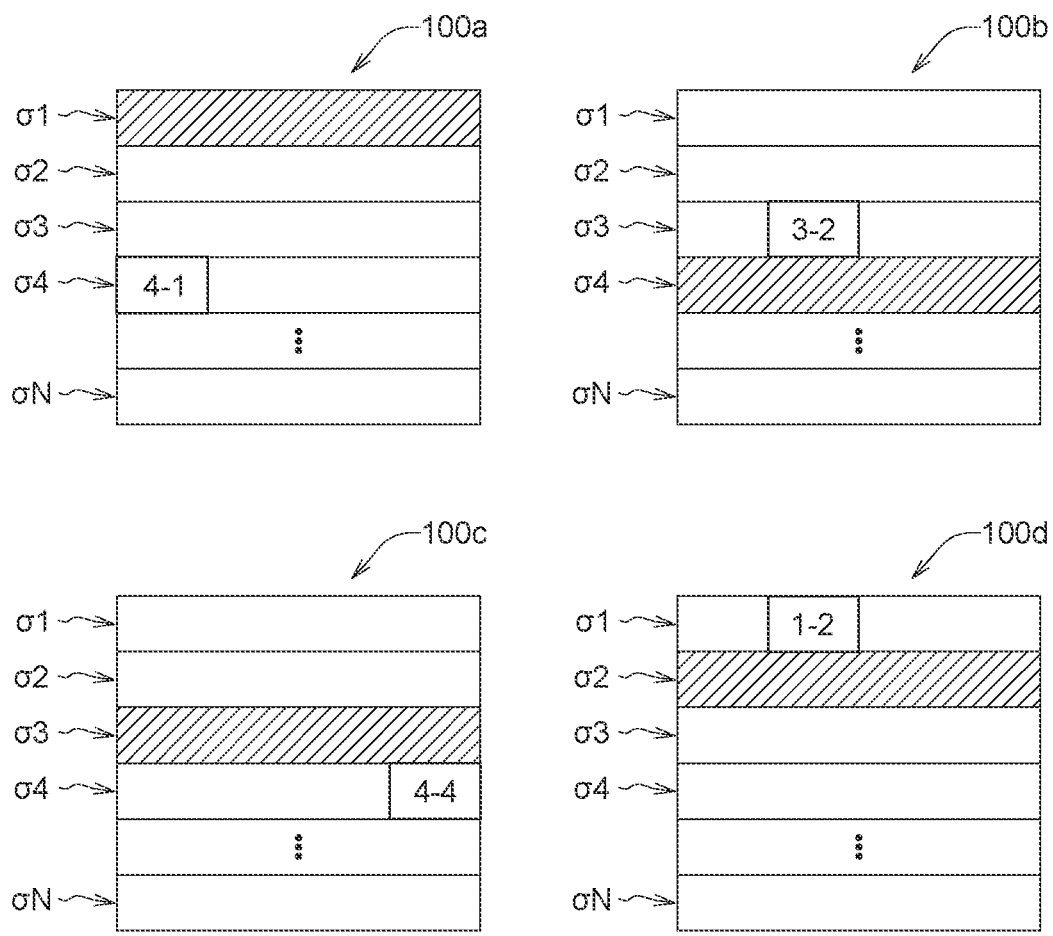

FIGS. 3A and 3B are schematic diagrams illustrating calculation for local energy value performed by the memory device 1000 of FIG. 2. Referring to FIG. 3A, in the first operation cycle T1, the control circuit 700 selects memory units of the second horizontal row, the third horizontal row, the first horizontal row and the fourth horizontal row in the memory arrays 100a-100d respectively. The selected memory units are used to calculate the local energy values L2, L3, L1, and L4 of states σ2, σ3, σ1, and σ4 respectively. Then, the local energy values L1-L4 are summed up as the total energy value E.

Referring to FIG. 3B, in the second operation period T2, the control circuit 700 selects memory units in a horizontal row different from that selected in the operation period T1 in a stochastic manner. For example, in the operation cycle T2, the control circuit 700 selects memory units in the first horizontal row, the fourth horizontal row, the third horizontal row, and the second horizontal row in the memory arrays 100a-100d respectively. The selected memory units are used to calculate the local energy values L1, L4, L3 and L2 of states σ1, σ4, σ3 and σ2 respectively. Similarly, in the next operation cycle T3, the control circuit 700 randomly selects memory units in different horizontal rows to calculate local energy values (not shown).

By randomly selecting memory units of different horizontal rows in different operation cycles, it may avoid repeated computations on memory units of the same horizontal row, thereby reducing the influence of memory units with fail bits at specific positions. As shown in FIG. 3A, the memory arrays 100a, 100b, 100c and 100d have defective memory units 4-1, 3-2, 4-4, and 1-2 respectively. Therefore, in the first operation cycle T1, the defective memory unit 3-2 in the memory array 100b will cause a calculation error for the local energy value L3 of the state σ3. However, as shown in FIG. 3B, in the second operation cycle T2, memory units of different horizontal rows (i.e., the fourth horizontal row) may be selected from the memory array 100b to calculate local energy values, that can avoid influences from the memory unit 3-2.

Figure 4:
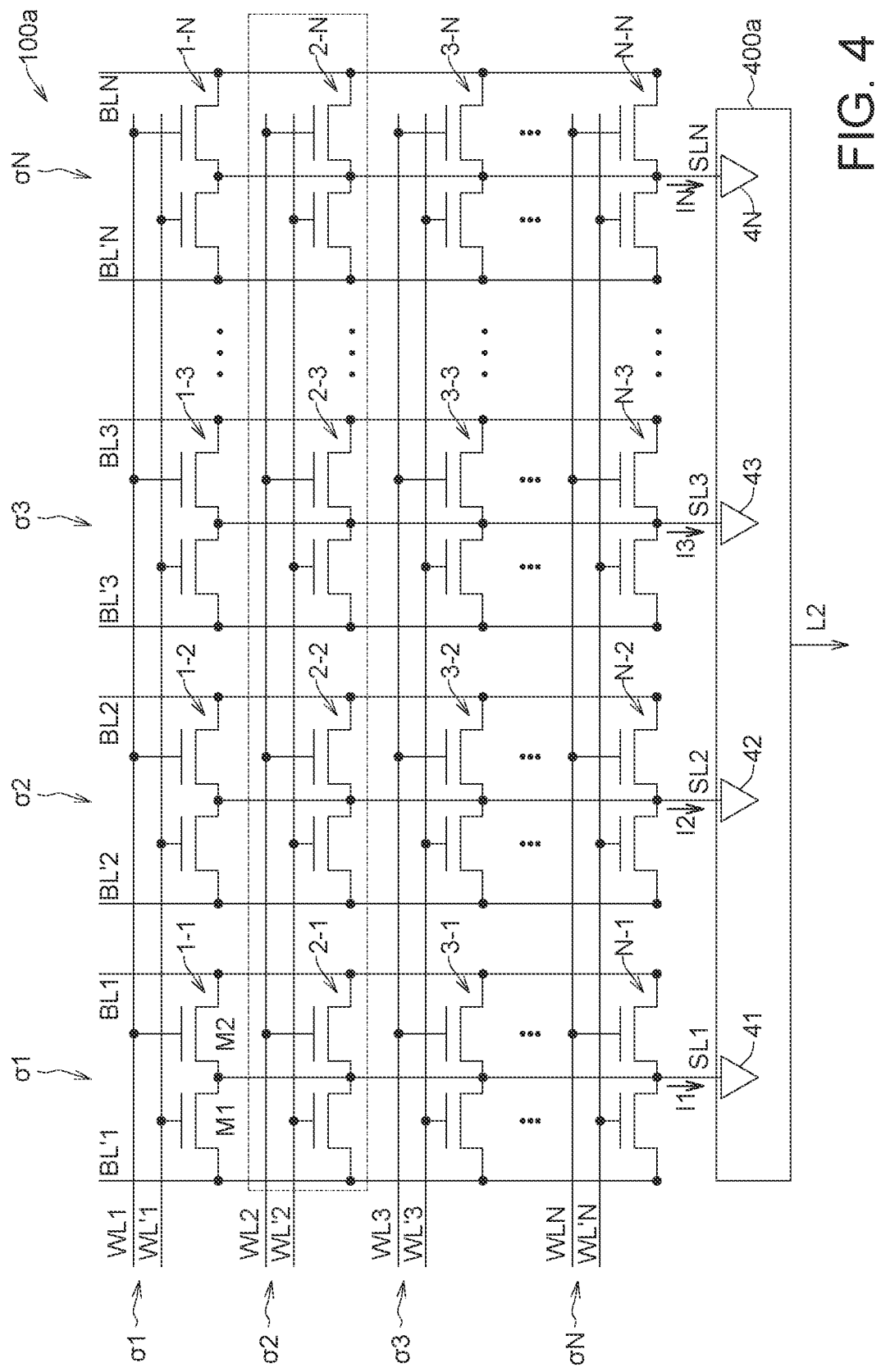
FIG. 4 is a circuit diagram of one memory array in the memory device of FIG. 2.

FIG. 4 is a circuit diagram of one memory array 100a in the memory device of FIG. 2. Referring to FIG. 4, each of the memory units 1-1 to N-N of the memory array 100a includes two transistors, which are connected in a "common source" manner. For example, the memory unit 1-1 includes a transistor M1 and a transistor M2, the sources of which are commonly connected to the source line SL1, and the source line SL1 is connected to the sense amplifier 41 in the sensing circuit 400a. In addition, the drain and gate of the transistor M1 are respectively connected to the inverse bit line BL'1 and the inverse word line WL'1, and the drain and gate of the transistor M2 are respectively connected to the bit line BL1 and the word line WL1. Similarly, the drains of the two transistors of each of the other memory units 2-1 to N-1 arranged in the first vertical column are respectively connected to the bit line BL1 and the inverse bit line BL'1, whose gates are respectively connected to the word lines WL2-WLN and the inverse word lines WL'2-WL'N, and their sources are commonly connected to the source line SL1. The currents generated by the memory units 1-1 to N-1 in the first vertical column are summed up into a current I1 in the source line SL1, and the current I1 is transmitted to the sense amplifier 41. Based on a similar connection manner, the currents generated by the memory units 1-2 to N-2 of the second vertical column are summed up to the current I2 in the source line SL2, and the currents generated by the memory units 1-3 to N-3 of the third vertical column are summed up to the current I3 in the source line SL3, and so on.

In operation, the control circuit 700 randomly selects the memory units of one horizontal row of the memory array 100a, for example, selects the memory units 2-1 to 2-N in the second horizontal row. The selected memory units 2-1 to 2-N are used to calculate the local energy value L2 of the state σ2. Voltages may be applied to the gates of the transistors of the memory units 2-1 to 2-N through the word line WL2 and the inverse word line WL'2, and the voltages applied by the word line WL2 and the inverse word line WL'2 correspond to state σ2. For example, if word line WL2 is applied with a voltage of a first voltage level, and word line WL'2 is applied with a voltage of a second voltage level, it corresponds to the state σ2=−1. The first voltage level is a high voltage level, the second voltage level is a low voltage level, and the first voltage level is greater than the second voltage level. On the other hand, voltages may be applied to the drains of the transistors of the memory units 2-1 to 2-N through the bit lines BL1 to BLN and the inverse bit lines BL'1 to BL'N respectively, and the applied voltages correspond to the state σ1-σN. In response to the above-mentioned voltages, the transistors of the memory units 2-1 to 2-N may output source-currents at the sources, and are summed up in the source lines SL1-SLN to form the currents I1-IN respectively. The sensing amplifiers 41-4N of the sensing circuit 400a may receive and process the currents I1-IN, and sum up the currents I1-IN to obtain the local energy value L2 of the state σ2.

Figure 5A:
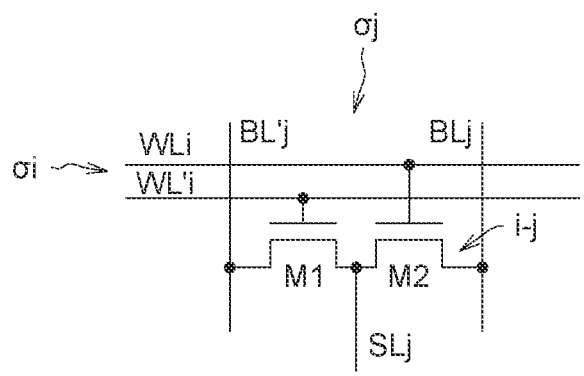
FIG. 5A is a circuit diagram of one memory unit in the memory array of FIG. 4.
Figure 5B:
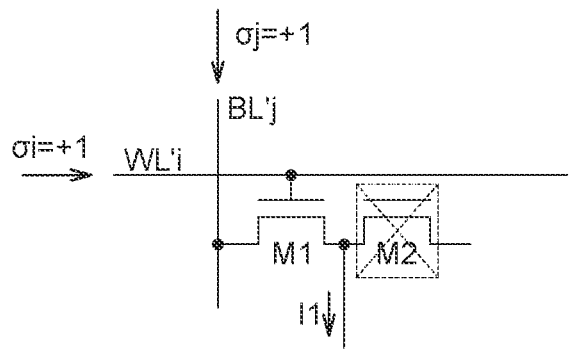
FIGS. 5B and 5C are schematic diagrams illustrating operation of the memory unit of FIG. 5A.
Figure 5C:
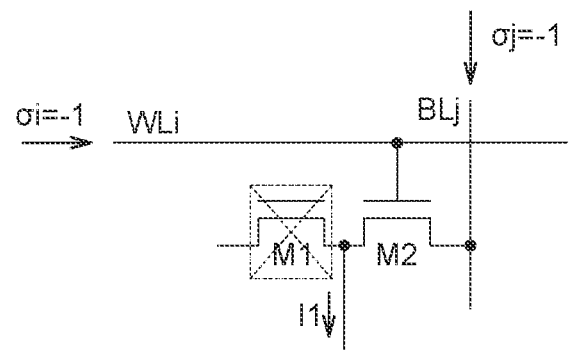

FIG. 5A is a circuit diagram of one memory unit i-j in the memory array 100a of FIG. 4, and FIGS. 5B and 5C are schematic diagrams illustrating operation of the memory unit i-j of FIG. 5A. Please refer to FIGS. 5A to 5C, the memory unit i-j is arranged at a position of the i-th horizontal row and the j-th vertical column of the memory array 100*a*. The drains of the transistors M1 and M2 of the memory unit i-j are respectively connected to the j-th inverse bit line BL'j and bit line BLj, and the gates of the transistors M1 and M2 are respectively connected to the i-th inverse word line WL'i and word line WLi, and the sources of the transistors M1 and M2 are commonly connected to the j-th source line SLj.

In operation, a voltage may be input to the gates of the transistors M1, M2 through the inverse word line WL'i and the word line WLi, and this voltage corresponds to the i-th state σi. When the word line WLi and the inverse word line WL'i input voltages with the first voltage level and the second voltage level respectively, it may correspond to the state σi=−1. When the word line WLi and the inverse word line WL'i input voltages with the second voltage level and the first voltage level respectively, it may correspond to the state σi=+1. Similarly, voltages may be input to the drains of transistors M1, M2 through inverse bit line BL'j and bit line BLj, and this voltage corresponds to the j-th state σj. As shown in FIG. 5B, when both the inverse word line WL'i and the inverse bit line BL'j input a voltage with the first voltage level, it means that the state σi=+1 and the state σj=+1, then transistor M1 may be turned on to output current I1 at the source. As shown in FIG. 5C, when the word line WLi and the bit line BLj input the voltage with the first voltage level, it indicates that the state σi=−1 and the state σj=−1, and the transistor M2 may be turned on to output current I1 at the source. Accordingly, a "XNOR" operation of the state σi and the state σj may be performed by the transistors M1 and M2, which may represent the coupling of the state σi and the state σj.

On the other hand, in the example of FIG. 5C, if the threshold voltage Vt of the transistor M2 is programmed to be a first threshold voltage with a high voltage level, even if the word line WLi and the bit line BLj input a voltage with the first voltage level, the transistor M2 still cannot be turned on and does not output current at the source. Accordingly, an "AND" operation of the states σi and σj may be performed by the transistor M1 and the transistor M2 which is programmed to the first threshold voltage, which may represent the components of the external magnetic field. In addition, the memory units i-j may further correspond to the mutual-coefficient Jij or the self-coefficient hi of the Ising model. The mutual-coefficient Jij represents the coupling strength between the state σi and the state σj, and the self-coefficient hi represents the strength of external magnetic field. The value of the mutual-coefficient Jij or the self-coefficient hi may be defined according to the threshold voltages of the transistors M1 and M2. When the threshold voltages of the transistors M1 and M2 are programmed to the first threshold voltage with a high voltage level, the transistors M1 and M2 cannot be turned on, hence the mutual-coefficient Jij or the self-coefficient hi are defined as zero.

From the above, the local energy value Li of the state σi may be calculated by all the memory units i-j (j=1 to N) in the i-th horizontal row, as shown in equation (2):

$$Li = \sum_{j \neq i} Jij(\sigma i \text{XNOR} \sigma j) + hi(\sigma i \text{ AND } \sigma i) \qquad (2)$$

$$= \frac{1}{2}\left\{\sum_{j \neq i} Jij(\sigma i \sigma j) + hi\sigma i\right\} + \frac{1}{2}\left\{\sum_{j \neq i} Jij + hi\right\}$$

According to equation (2), the logical "XNOR" computation result of state σi is multiplied with the mutual-coefficient Jij to obtain a first product. The logical "AND" computation result of state σi is multiplied with the self-coefficient hi to obtain a second product. The sum of the first product and the second product is equal to the local energy value Li of the state σi.

Please refer to the example of FIG. 4 again, the local energy value L2 of the state σ2 may be calculated by the memory units 2-1 to 2-N of the second horizontal row, as shown in equation (3):

$$L2 = \sum_{j \neq 2} J2j\sigma 2\sigma j + h2\ \sigma 2 \qquad (3\text{-}1)$$

Then, a probability function value P2 is calculated according to the local energy value L2, as shown in equation (3-2):

$$P2 = \text{Sigmoid}\left(\frac{L2}{T} - q\right) \qquad (3\text{-}2)$$

When the probability function value P is greater than a predefined value R, the state σ2 may be updated. For example, flipping the numeric value of state σ2 from "+1" to "−1", or from "−1" to "+1".

Figure 6:
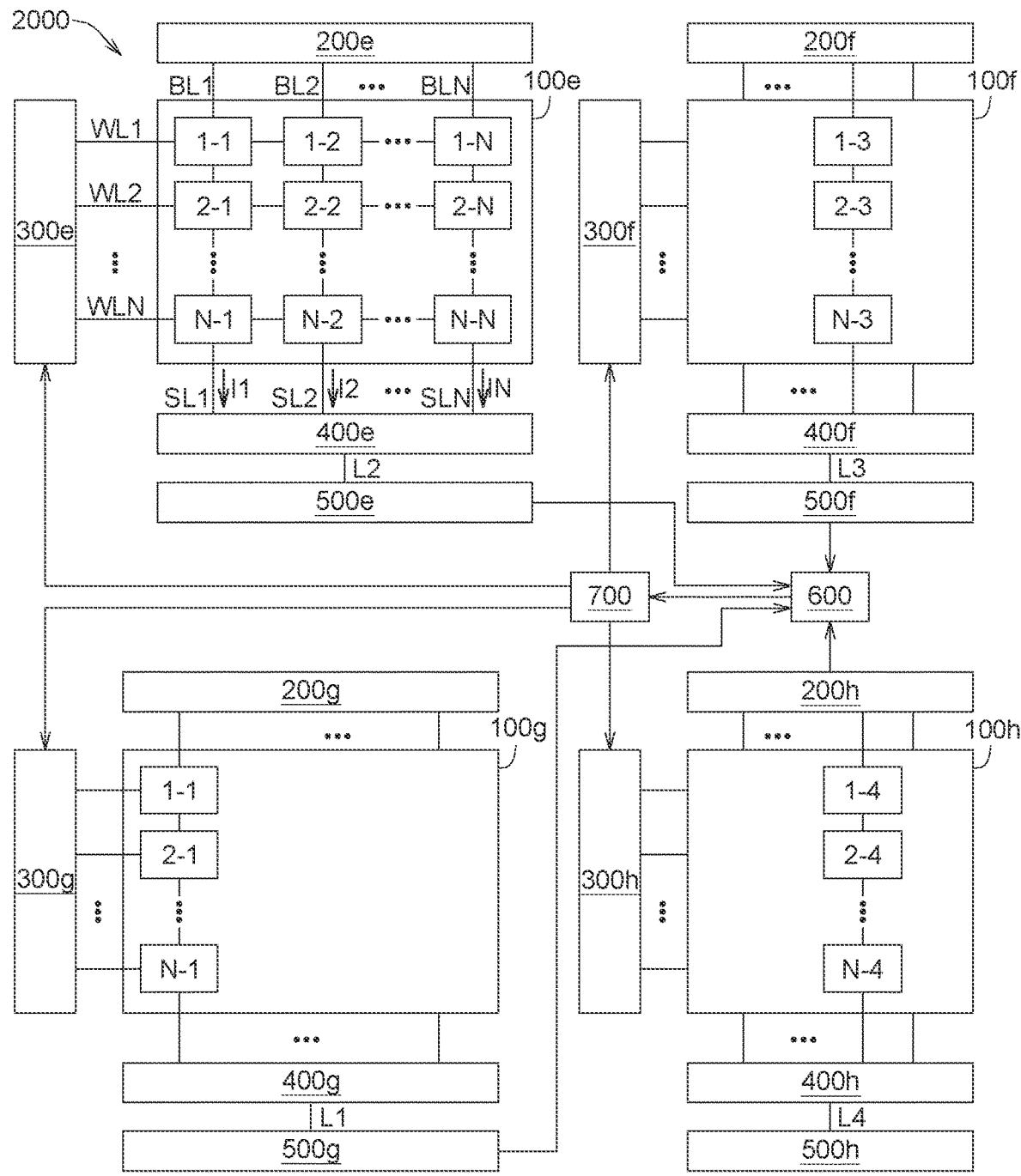
FIG. 6 is a schematic diagram of a memory device according to another embodiment of the present disclosure.

FIG. 6 is a schematic diagram of a memory device 2000 according to another embodiment of the present disclosure. Different from the memory device 1000 of FIG. 2 where a memory unit in a horizontal row (e.g., the i-th horizontal row) is selected from the memory array, the selected memory units are used to calculate the local energy value Li of the state σi, the memory device 2000 of FIG. 6 refers to select memory units in a vertical column (e.g., the j-th vertical column) from the memory array, the selected memory units are used to calculate the local energy value Lj of the state σj. For example, the memory units 1-2 to N-2 of the second vertical column are selected from the memory array 100*e* of the memory device 2000, the memory units 1-3 to N-3 of the third vertical column are selected from the memory array 100*f*, the memory units 1-1 to N-1 of the first vertical column are selected from the memory array 100*g*, and memory units 1-4 to N-4 of the fourth vertical column are selected from the memory array 100*h*. The selected memory units 1-2 to N-2 are used to calculate the local energy value L2 of the state σ2, the selected memory units 1-3 to N-3 are used to calculate the local energy value L3 of the state σ3, the selected memory units 1-1 to N-1 are used to calculate the local energy value L1 of the state σ1, and the selected memory units 1-4 to N-4 are used to calculate the local energy value L4 of the state σ4.

In addition, different from the memory units 1-1 to N-N of the memory device 1000 of FIG. 2 which are composed of two transistors, the memory units 1-1 to N-N of the memory device 2000 of FIG. 6 are composed of conductance elements. Furthermore, different from the memory device 1000 of FIG. 2 in which the word line WLi, the inverse word line WL'i, the bit line BLj and the inverse bit line BL'j are arranged in pairs, the word line WLi and the bit line BLj of the memory device 2000 of FIG. 6 are arranged in a single manner. That is, the memory device 2000 is not provided with the inverse word line WL'i and the inverse bit line BL'j. More particularly, the first end of the conductance element of the memory device 2000 is connected to the word line WLi, and the second end of the conductance element is connected to the bit line BLi.

Figure 7:
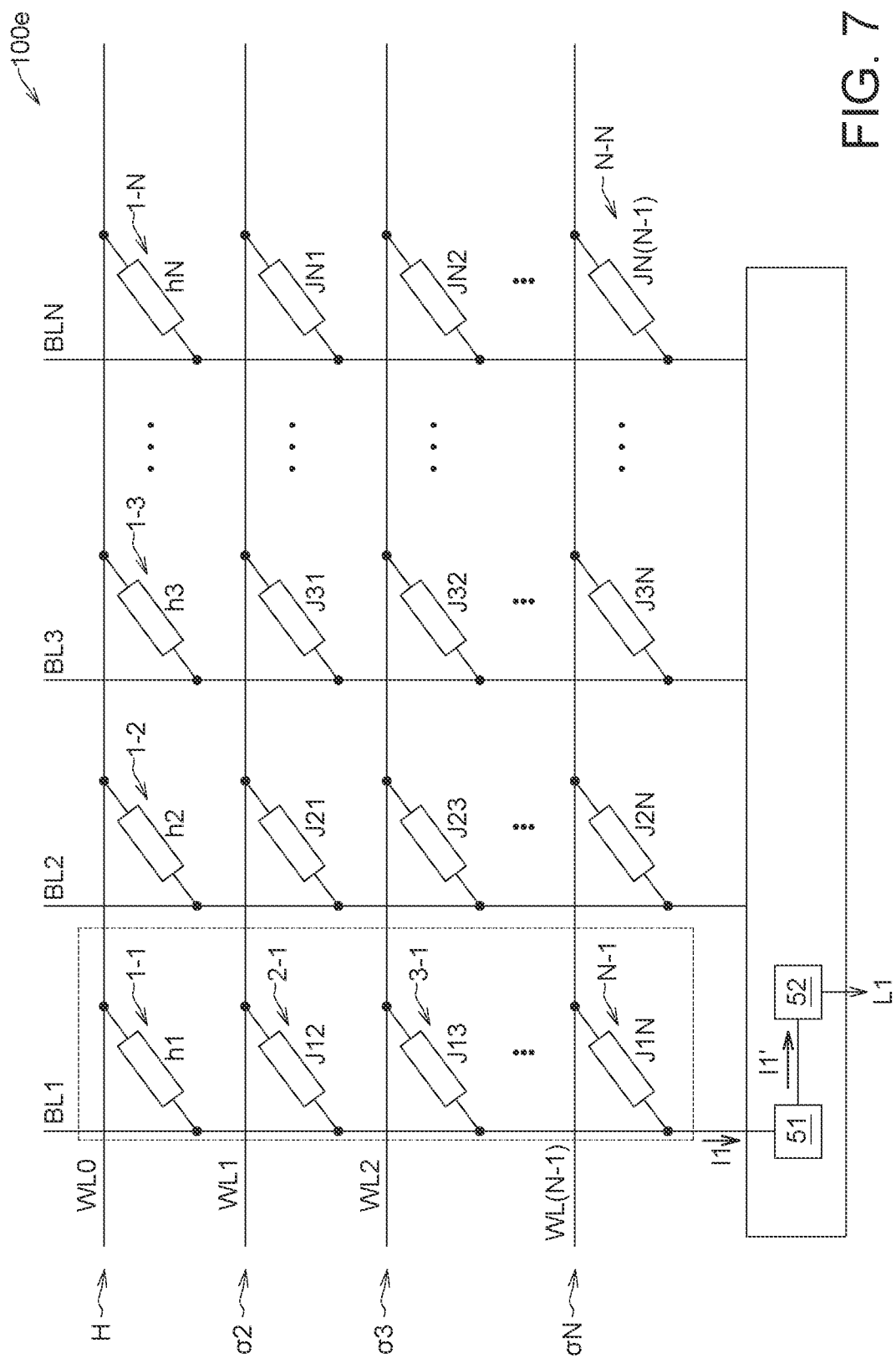
FIG. 7 is a circuit diagram of one memory array in the memory device of FIG. 6.

FIG. 7 is a circuit diagram of one memory array 100*e* in the memory device of FIG. 6. Referring to FIG. 7, each of the memory units 1-1 to N-N of the memory array 100e is a conductance element, and the conductance value Gij thereof may represent the value of the self-coefficient hj or the mutual-coefficient Jij. The memory units 1-1 to 1-N of the first horizontal row have self-coefficients h1-hN, and the memory units 2-1 to N-N of the second horizontal row to the N-th horizontal row have mutual-coefficients J12 to JN(N−1).

In operation, in the first operation cycle T1, the memory units 1-1 to N-1 of the first vertical column may be selected, and the selected memory units 1-1 to N-1 are used to calculate the local energy value L1 of the state σ1. Voltages corresponding to states σ2-σN may be applied via word lines WL1 to WL(N−1) respectively. The applied voltage may have a first voltage level (of a high voltage level) or a second voltage level (of a low voltage level). The voltage of the first voltage level corresponds to the state σi=+1, and the voltage of the second voltage level corresponds to the state σi=−1. In addition, a fixed voltage H is applied through the word line WL0, and the fixed voltage H has a first voltage level (of a high voltage level). Accordingly, the conductance elements of the memory units 1-1 to N-1 in the first vertical column may generate current in response to the voltages of the word lines WL0 to WL(N−1), and the generated current is summed up to form a current I1 on the bit line BL1. The current I1 may be expressed as equation (4), where Vi is the voltage applied by the word line WLi, and Gij is the conductance value of the memory unit i-j:

$$I1 = \Sigma_{j=1 \cdot i=1-N} Gij \times Vi = \{\Sigma_{i=2-N} J1i \times \sigma i\} + h1 \quad (4)$$

Then, an analog-to-digital converter (ADC) 51 of the sensing circuit 400e may convert the current I1 into a digital output value I1′. Furthermore, the multiplier 52 may perform a multiplying operation on the digital output value I1′ and the numeric value of the state σ1, so to obtain the local energy value L1. The local energy value L1 may be expressed as equation (5):

$$L1 = \sigma1 \times I1' = \{\Sigma_{i=2-N} J1i \times \sigma1 \sigma i\} + h1 \, \sigma1 \quad (5)$$

According to equation (5), the logical "XNOR" computation result of state σ1 is multiplied with the mutual-coefficient J1i to obtain a first product. The logical "AND" computation result of state σ1 is multiplied with the self-coefficient h1 to obtain a second product. The sum of the first product and the second product is equal to the local energy value L1 of the state σ1.

Figure 8A:
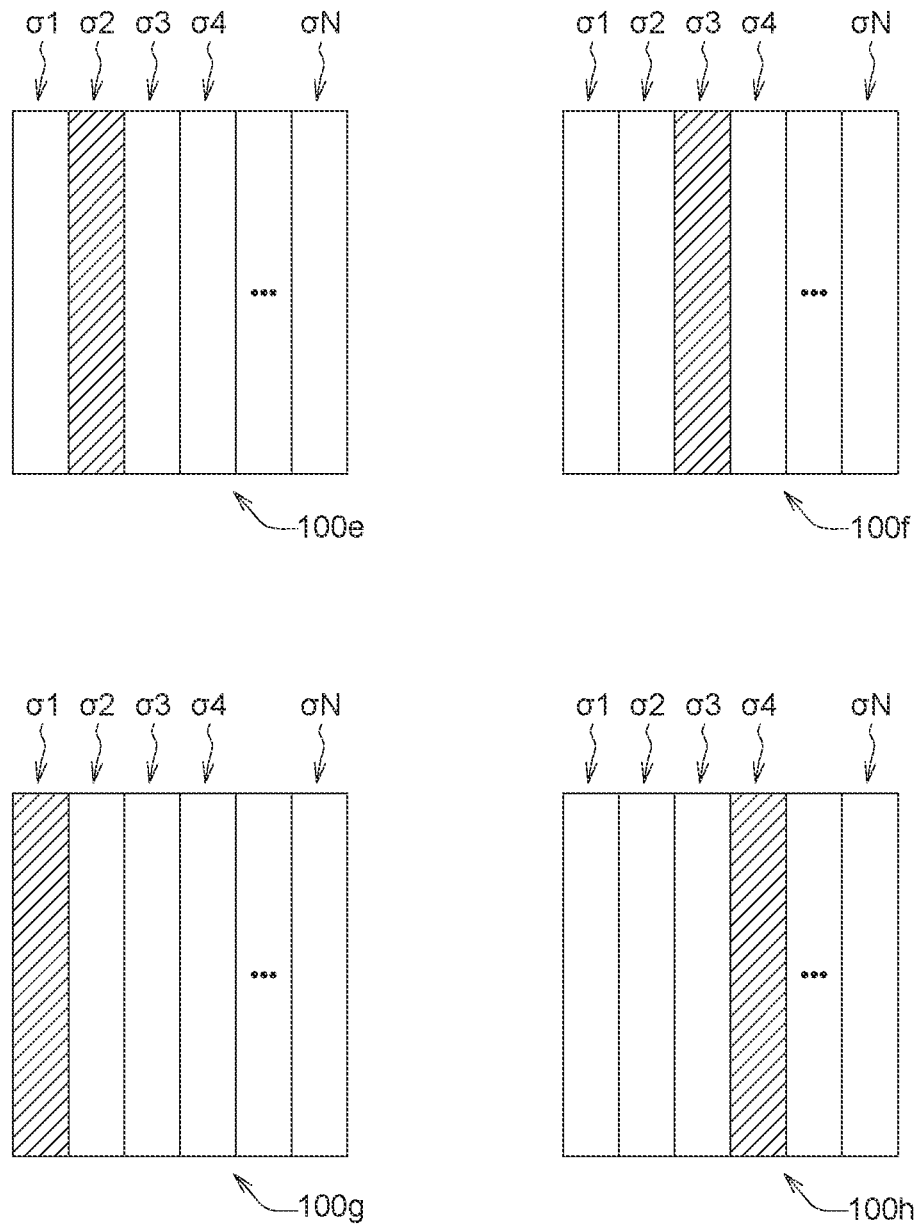
FIGS. 8A and 8B are schematic diagrams illustrating calculation of energy value performed by the memory device of FIG. 6.
Figure 8B:
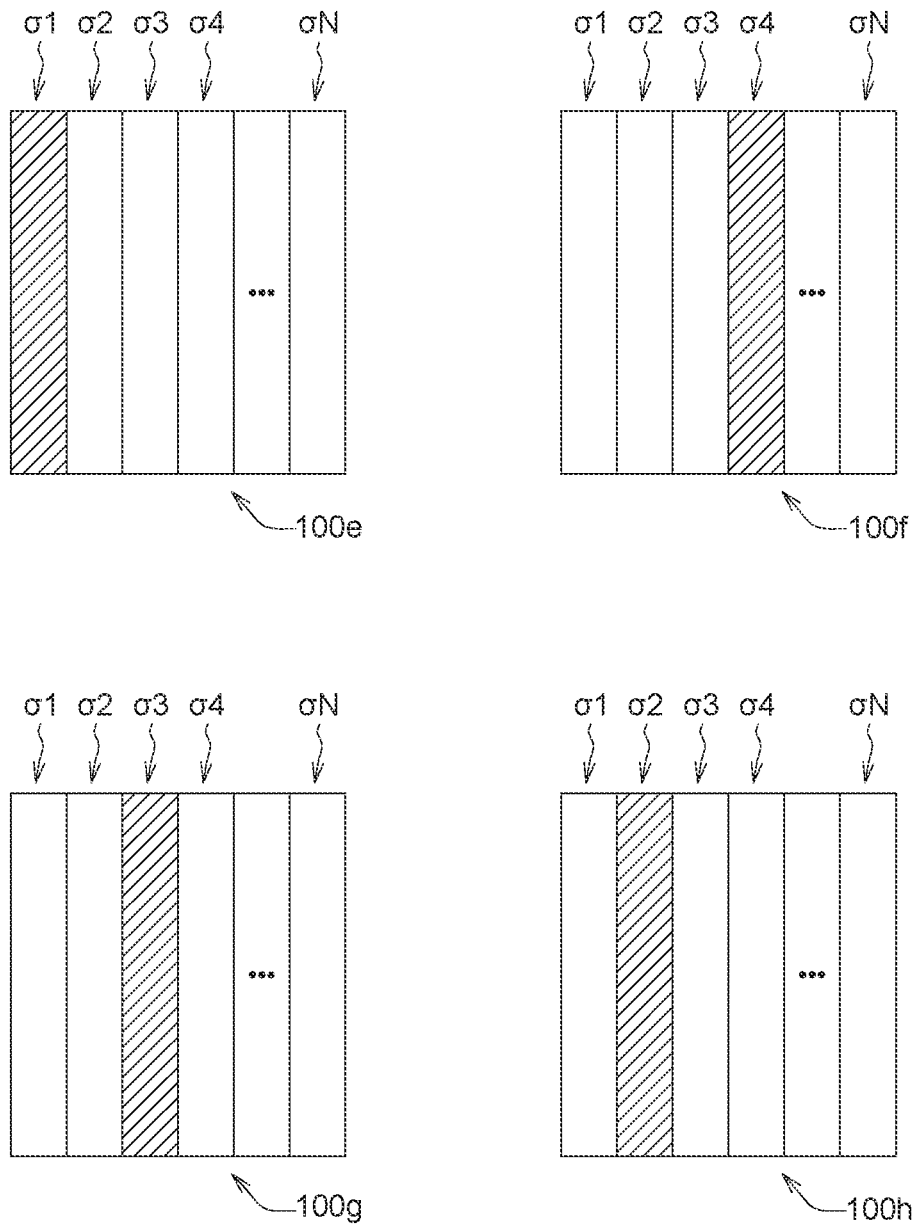

FIGS. 8A and 8B are schematic diagrams illustrating calculation of energy value performed by the memory device 2000 of FIG. 6. Please refer to FIG. 8A first, in the first operation cycle T1, the control circuit 700 selects the second vertical column, the third vertical column, the first vertical column and the fourth vertical column in the memory arrays 100e-100h respectively. The selected memory units are used to calculate the local energy values L2, L3, L1 and L4 of states σ2, σ3, σ1 and σ4 respectively. Then, the local energy values L1-L4 are summed up as the total energy value E.

Please refer to FIG. 8B, in the second operation period T2, the control circuit 700 randomly selects memory units in the vertical columns that are different from those selected in the operation period T1. For example, in the operation period T2, the control circuit 700 selects the memory units in the first vertical column, the fourth vertical column, the third vertical column and the second vertical column in the memory arrays 100e-100h respectively, and the selected memory units are used to calculate the local energy values L1, L4, L3, and L2 of states σ1, σ4, σ3 and σ2 respectively.

Figure 9A:
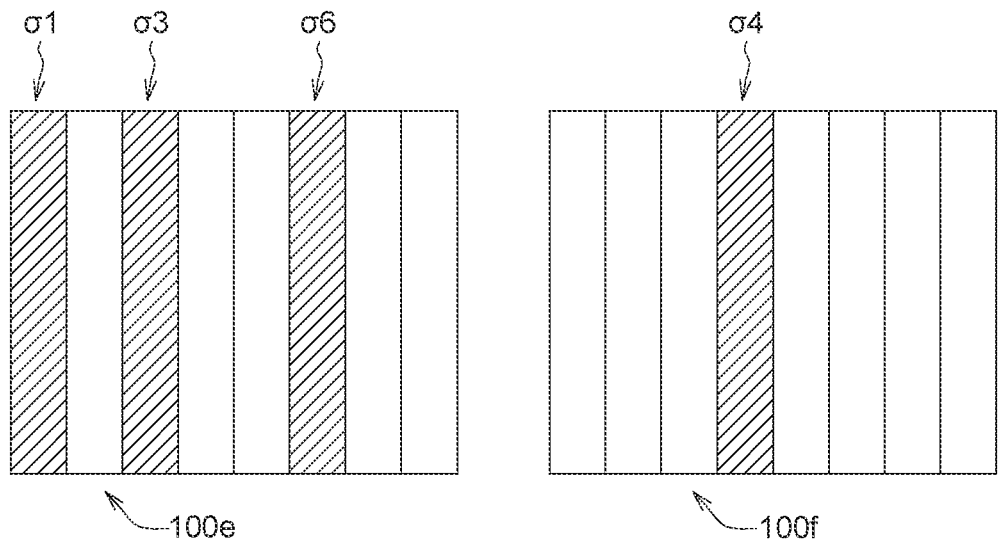
FIGS. 9A-9C are schematic diagrams illustrating another example of calculation for energy value performed by the memory device of FIG. 6.
Figure 9A:
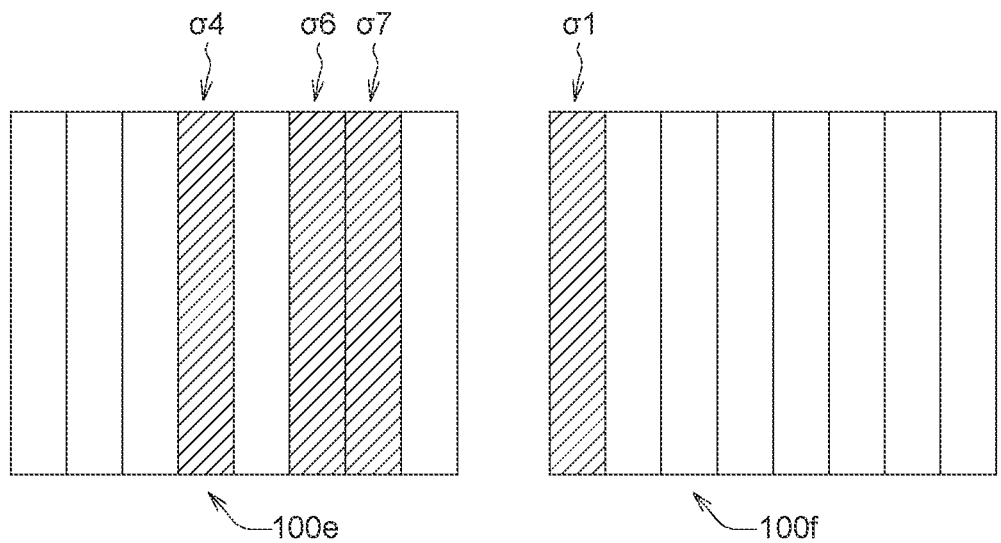
Figure 9B:
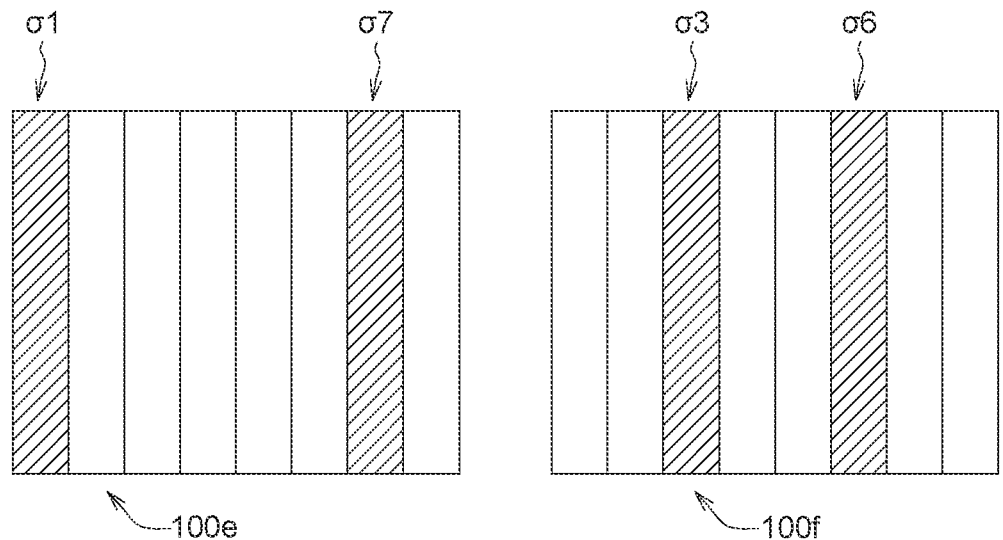
Figure 9B:
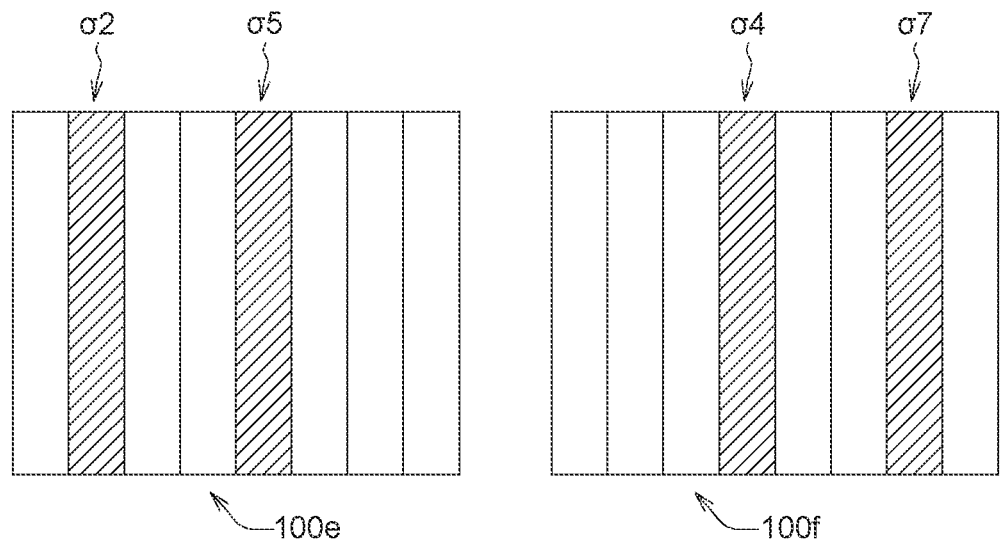
Figure 9C:
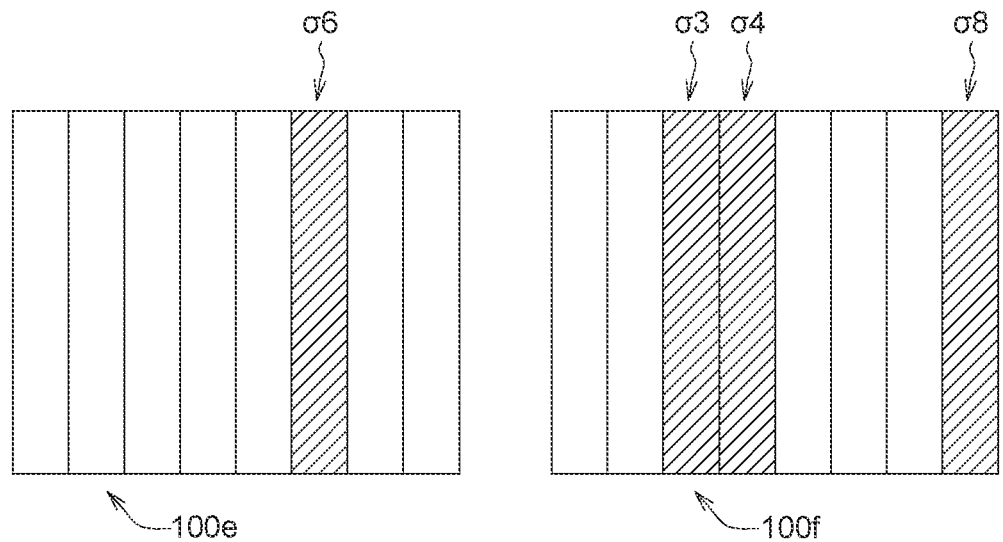
Figure 9C:
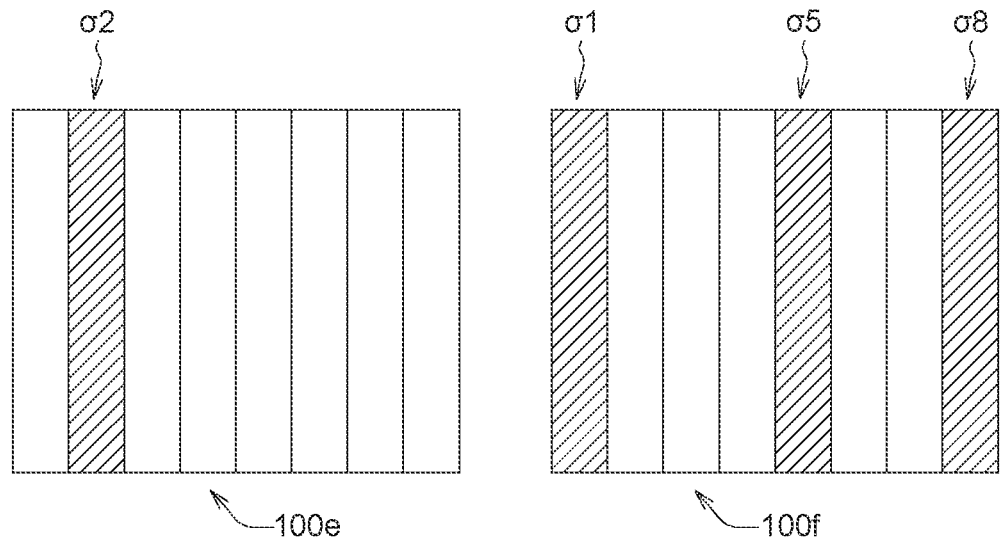

FIGS. 9A-9C are schematic diagrams illustrating another example of calculation for energy value performed by the memory device 2000 of FIG. 6. When the memory device 2000 performs the anneal computation, in an early stage of the anneal computation with high temperature, a larger amount of horizontal rows or vertical columns may be selected in the memory array with a higher bit error rate (BER), so as to compute a larger amount of states σi. Then, in later stages of the anneal computation with low temperature, a larger amount of states σi are computed in the memory array with a lower bit error rate.

As shown in FIG. 9A, the memory array 100e has a higher bit error rate, while the memory array 100f has a lower bit error rate. In addition, the early stage of the anneal computation is, for example, the first stage, and the first stage includes operation periods T1-Tn. Furthermore, the intermediate stage of the anneal computation includes operation periods T(n+1)-Tm. Moreover, the later stage of the anneal computation is, for example, the second stage, and the second stage includes operation periods T(m+1)-T(s).

In the operation cycle T1 of the first stage of the anneal computation, a first amount of horizontal rows or vertical columns of memory units may be randomly selected from the memory array 100e. The first amount is, for example, "three", so to calculate local energy values of three states σ1, σ3 and σ6. Furthermore, a second amount horizontal rows or vertical columns of memory units are randomly selected from the memory array 100f. The second amount is for example "one", so as to calculate local energy value of one state σ4. The first amount is greater than the second amount. Then, in the subsequent operation cycle Tn of the first stage, the memory units in another three horizontal rows or vertical columns may be randomly selected in the memory array 100e, so as to calculate the local energy values of the other three states σ4, σ6 and σ7. Then, in the memory array 100f, the local energy value of another state σ1 is calculated.

Then, as shown in FIG. 9B, in an intermediate stage of the anneal computation, the amount of states σi calculated by the memory array 100e may be reduced. Furthermore, the amount of states σi calculated by the memory array 100f may be increased. For example, in the operation cycle T(n+1) in the intermediate stage, the local energy values of the two states σ1 and σ7 may be calculated in the memory array 100e, and the local energy values of the two states σ3 and σ6 may be calculated in the memory array 100f. Then, in the subsequent operation cycle Tm of the intermediate stage, the other two states σ2 and σ5 may be randomly selected in the memory array 100e to calculate their local energy values, and still other two states σ4 and σ7 may be randomly selected in the memory array 100f to calculate their local energy values.

Then, as shown in FIG. 9C, the amount of states σi calculated by the memory array 100e may be further reduced, and the amount of states σi calculated by the memory array 100f may be further increased. In the operation period T(m+1) of the second stage (i.e., the later stage) of the anneal computation, a third amount of horizontal rows or vertical columns of memory units may be randomly selected in the memory array 100e. For example, the third amount is "one", so to calculate the local energy value of one state σ6. In addition, a fourth amount of horizontal rows or vertical columns of memory units are randomly selected in the memory array 100f. For example, the fourth amount is "three", so as to calculate the local energy values of three states σ3, σ4 and σ8. Wherein, the third amount is smaller than the fourth amount. In addition, the third amount is smaller than the first amount in the first stage, and the fourth amount is larger than the second amount in the first stage. Then, in the subsequent operation cycle T(s) of the second stage, another horizontal row or vertical column of memory units may be randomly selected in the memory array 100e to calculate the local energy value of another state σ2. Furthermore, local energy values of other three states σ1, σ5 and σ8 may be calculated in the memory array 100f.

Figure 10A:
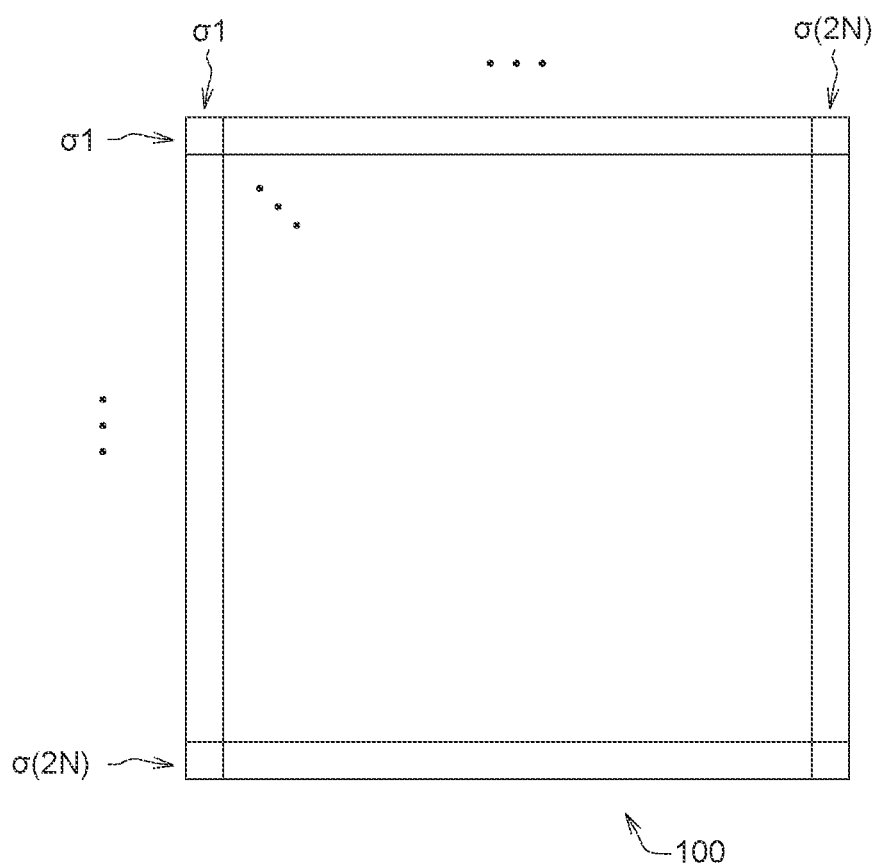
FIGS. 10A and 10B are schematic diagrams of a memory array and sub-arrays according to another embodiment of the present disclosure.
Figure 10B:
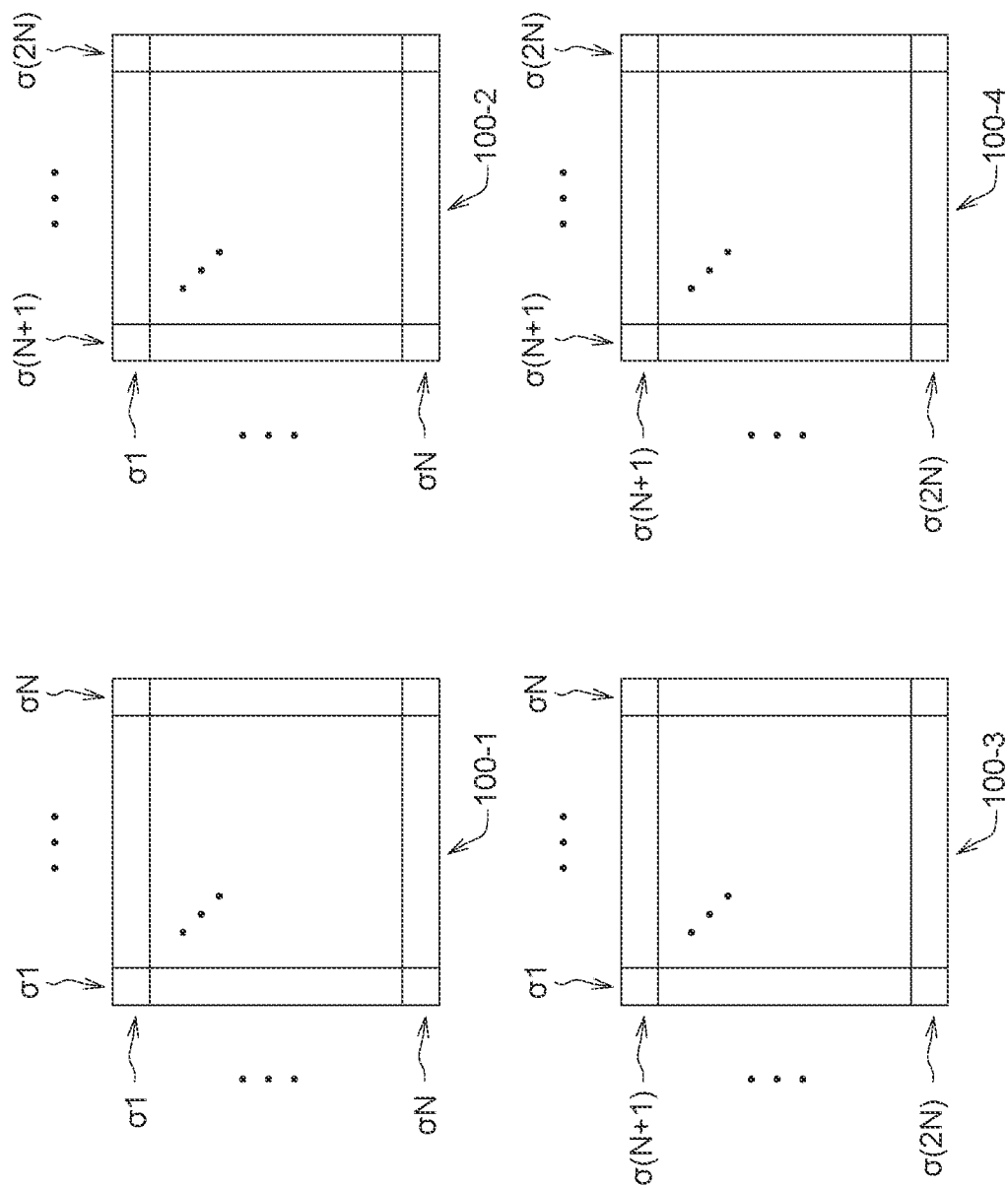

FIGS. 10A and 10B are schematic diagrams of a memory array 100 and sub-arrays 100-1 to 100-4 according to another embodiment of the present disclosure. The memory units of the memory array 100 of FIG. 10A are arranged in 2N's horizontal rows and 2N's vertical columns. Memory units of the memory array 100 may be used to calculate local energy values of 2N states σ1-σ(2N). In order to enhance the speed of the anneal computation, the memory array 100 may be divided into four sub-arrays 100-1 to 100-4 shown as FIG. 10B, so as to reduce setup time of bit lines or word lines of the sub-arrays 100-1 to 100-4. The memory units of each of the sub-arrays 100-1 to 100-4 are arranged in N's horizontal rows and N's vertical columns, which may be used to calculate local energy values of N states σ(1)-σ(N) or local energy values of N states σ(N+1)-σ(2N).

Figure 11A:
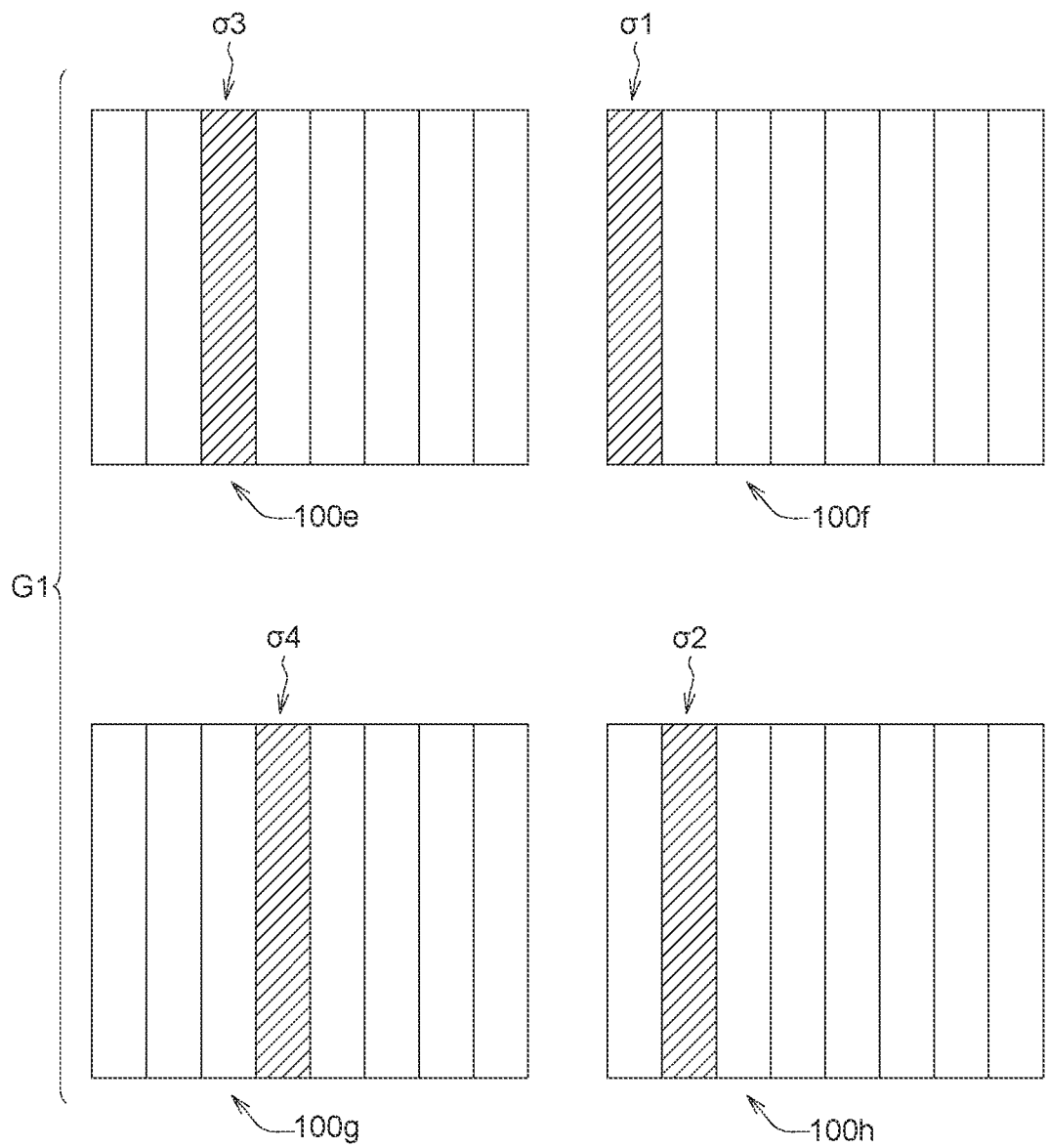
FIGS. 11A and 11B are schematic diagrams illustrating memory arrays being divided into groups, according to another embodiment of the present disclosure.
Figure 11B:
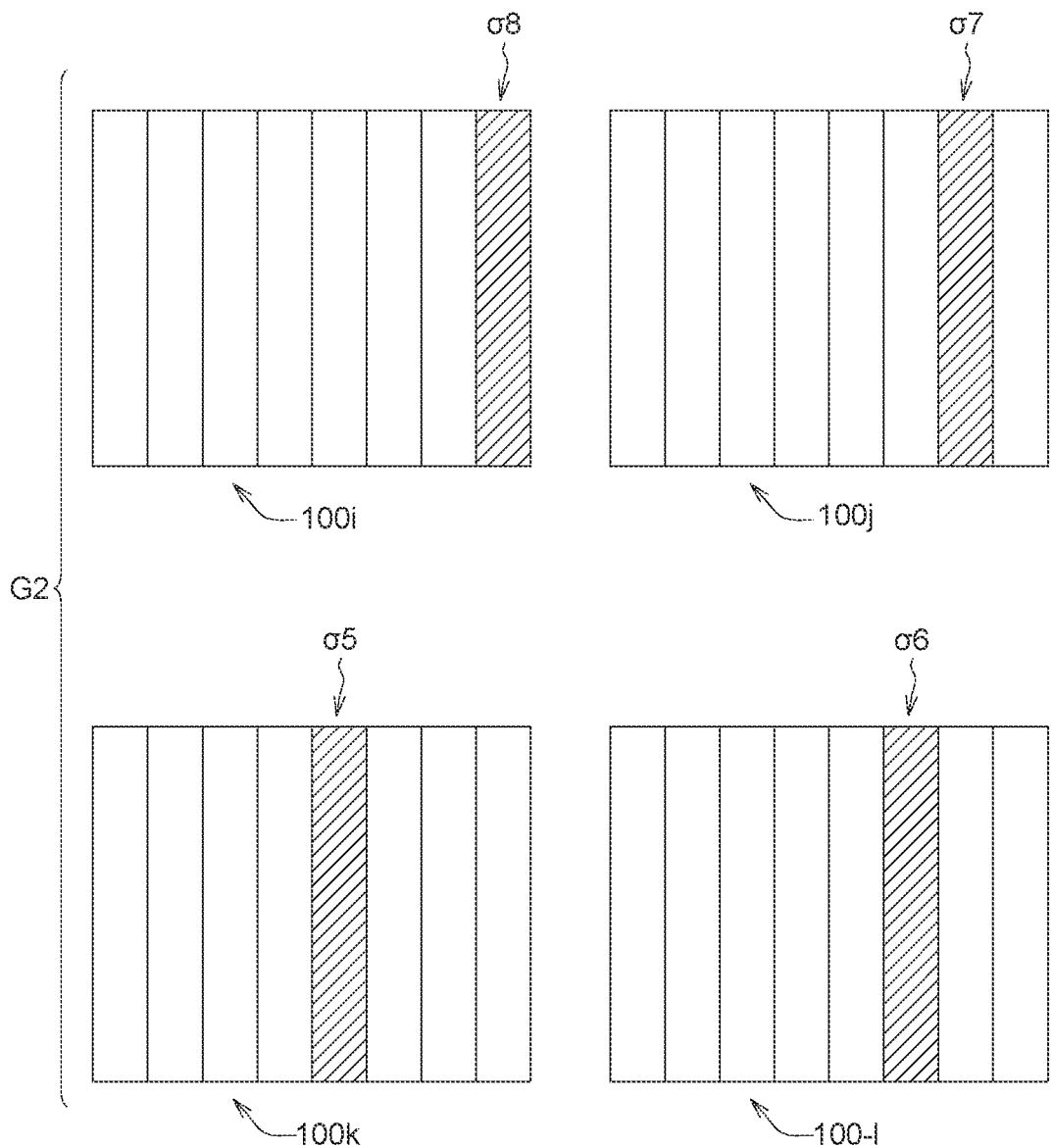

FIGS. 11A and 11B are schematic diagrams illustrating memory arrays 100e to 100-l being divided into groups, according to another embodiment of the present disclosure. The memory arrays 100e to 100-1 may be divided into two groups G1 and G2, and the states σ1-σ8 are allocated to the groups G1 and G2 to perform operations. As shown in FIG. 11A, the group G1 includes four memory arrays 100e, 100f, 100g and 100h. Four states σ1-σ4 out of the states σ1-σ8 may be allocated to the group G1 to perform energy value calculation. The memory arrays 100e, 100f, 100g and 100h may calculate local energy values of states σ8, σ7, σ5 and σ6, respectively. On the other hand, as shown in FIG. 11B, the other four states σ5-σ8 out of the states σ1-σ8 may be allocated to the memory arrays 100i, 100j, 100k and 100-1 of the group G2 for calculation.

Figure 12:
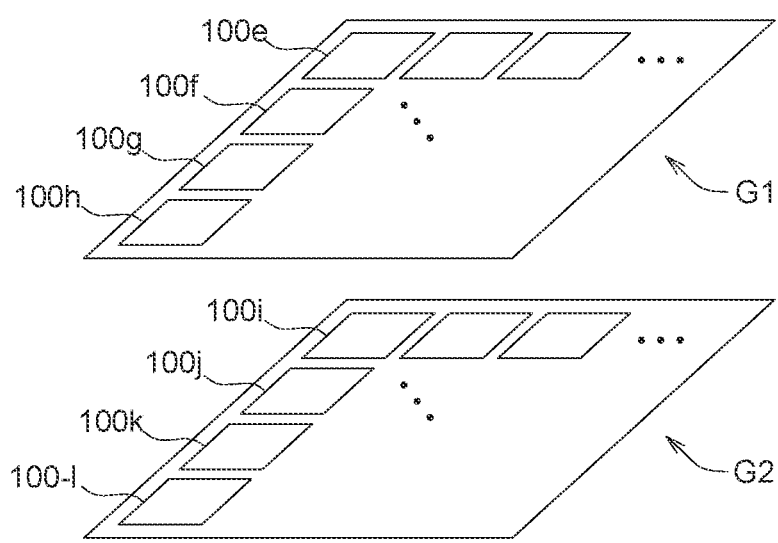
FIG. 12 is a schematic diagram of a memory device according to another embodiment of the present disclosure.

FIG. 12 is a schematic diagram of a memory device 2000b according to another embodiment of the present disclosure. The memory device 2000b may be a three-dimensional circuit, wherein a circuit of the first layer may be used to implement the memory arrays 100e-100h of the group G1 of FIG. 11A. Furthermore, the circuit of the second layer of the memory device 2000b may be used to implement the memory arrays 100i to 100-1 of the group G2 of FIG. 11B.

Figure 13A:
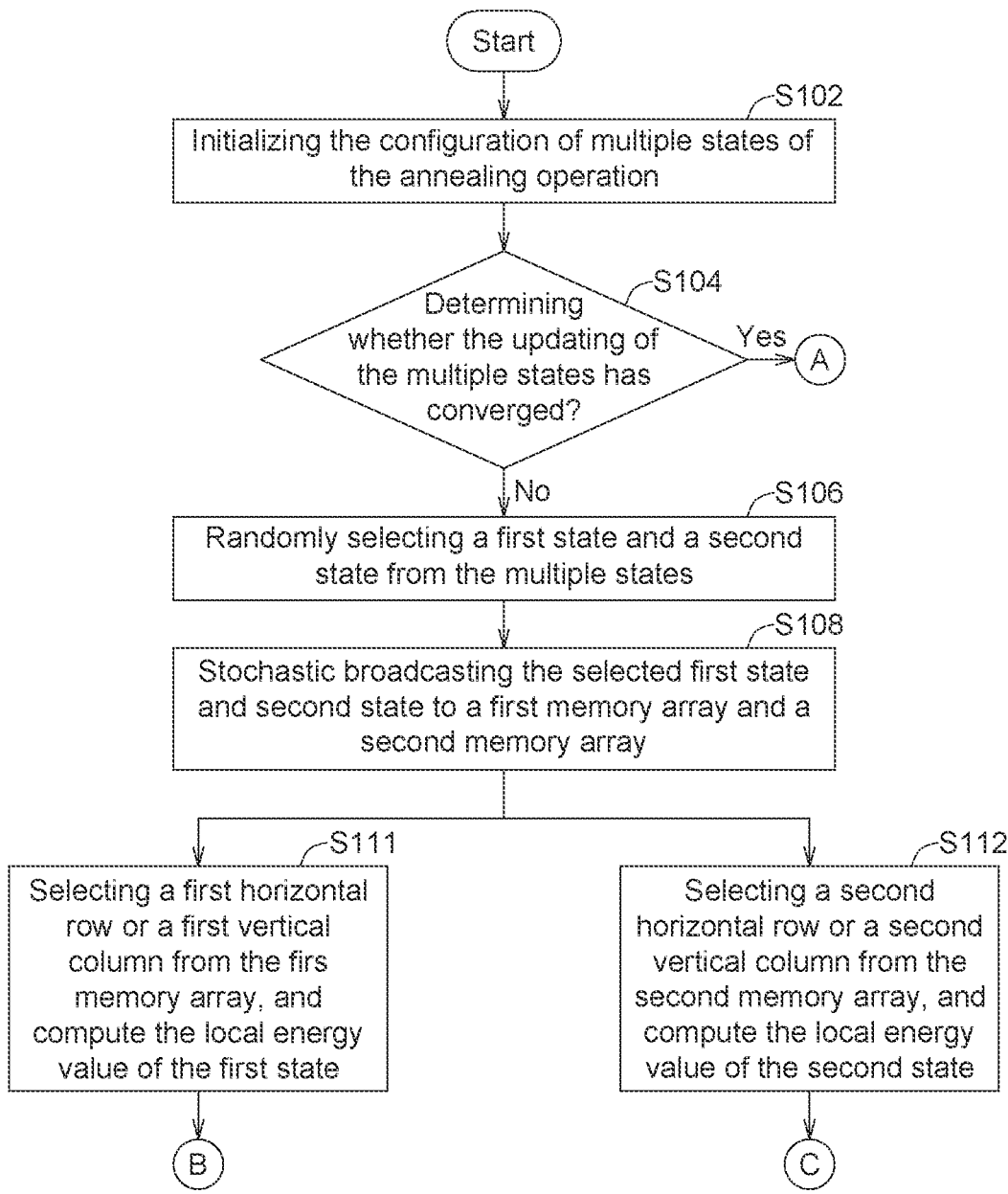
FIGS. 13A and 13B are flowcharts illustrating an operating method of a memory device according to an embodiment of the present disclosure.
Figure 13B:
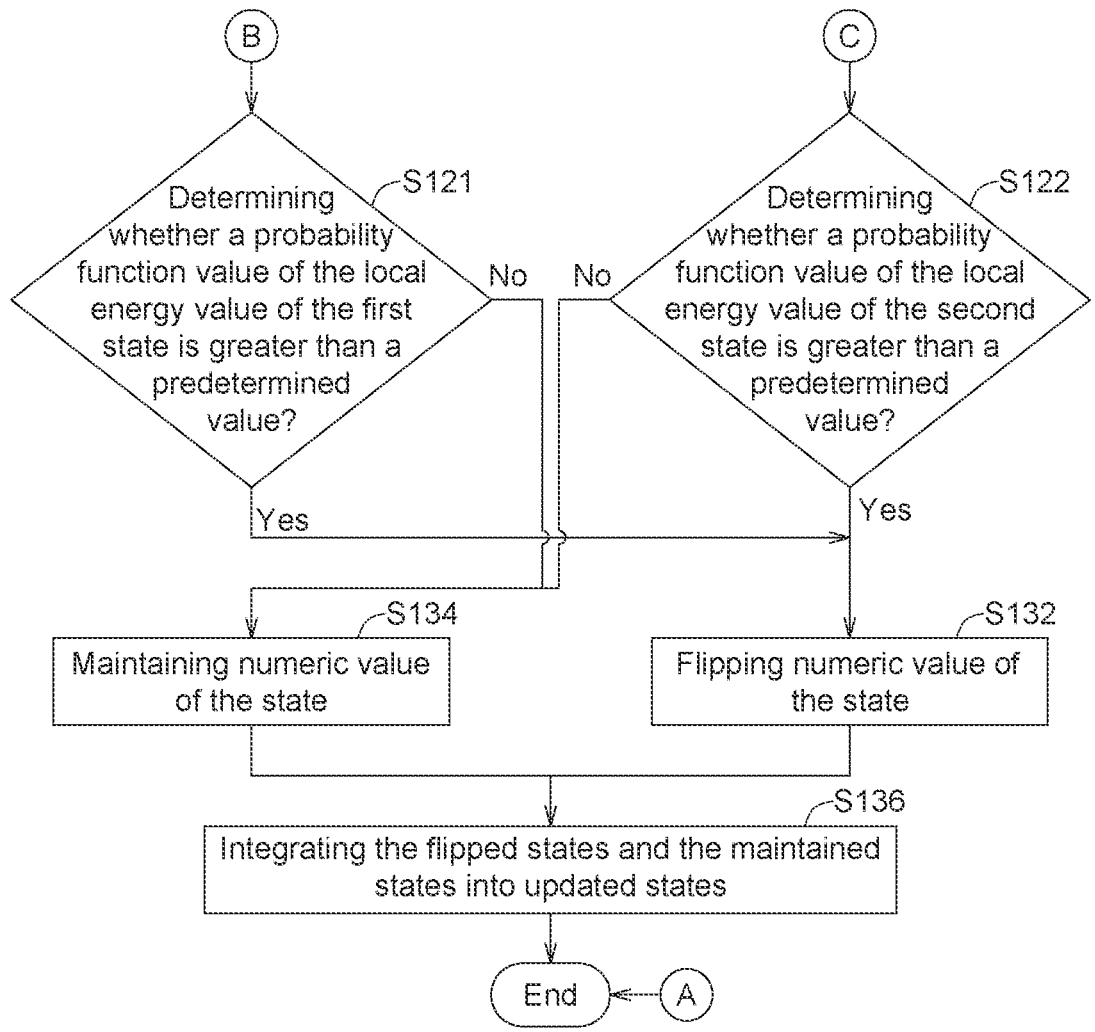

FIGS. 13A and 13B are flowcharts illustrating an operating method of a memory device according to an embodiment of the present disclosure. The operating method of the present disclosure may be applied to the memory device 2000 of FIGS. 2 and 4 or applied to the memory device 2000b of FIGS. 6 and 7. Please refer to FIG. 13A. First, in step S102, configurations of the states σ1-σN of the anneal computation are initialized. Then, in step S104, it is determined whether the updating of states σ1-σN have converged. If it's determined that it has converged, an optimal configuration for the states σ1-σN is obtained, and the operating method may be ended. If its determined that it has not converged, step S106 is performed, in which several states are randomly sampled from states σ1-σN of the anneal computation. For example, the first state σ1 and the second state σ2 are selected.

Then, in step S108, the selected states are stochastic broadcast to memory arrays of the memory device 2000 or the memory device 2000b. For example, in the memory device 2000, the first state σ1 may be allocated to the first memory array 100a out of the memory arrays, and the second state σ2 may be allocated to the second memory array 100b out of the memory arrays. On the other hand, in the memory device 2000b, the first state σ1 may be allocated to the first memory array 100e out of the memory arrays, and the second state σ2 may be allocated to the second memory array 100f out of the memory arrays.

Then, in step S111, the first horizontal row of memory units are selected from the first memory array 100a of the memory device 2000, or the first vertical raw of memory units are selected from the first memory array 100e of the memory device 2000b, and numeric value of the first state σ1 is received. Furthermore, local energy value L1 of the first state σ1 is calculated by the memory units of the first horizontal row or the first vertical column.

On the other hand, the step S112 may be executed in synchronization with the step S111 or after the step S111. In step S112, memory units of the second horizontal row are selected from the second memory array 100b of the memory device 2000, or memory units of the second vertical raw are selected from the second memory array 100f of the memory device 2000b. Furthermore, numeric value of the second state σ2 is received. In addition, local energy value L2 of the second state σ2 is calculated by the memory units of the second horizontal row or the second vertical column.

The operating method of this embodiment is described by taking two states σ1 and σ2 as an example. When calculating a plurality of states σ1-σN, the operating method further includes steps S113-S11N to calculate local energy values L3-LN of states σ3-σN. Steps S113-S11N are similar to step S111, which are not shown in FIG. 13A.

Then, steps S121 and S122 are respectively executed to determine whether the probability function values P1 and P2 (corresponding to local energy values L1 and L2) are greater than a predefined value R. The probability function values P1 and P2 are shown as equation (3-2). When calculating a plurality of states σ1-σN, the operating method further includes steps S123-S12N, so as to determine whether the probability function values P3-PN corresponding to states σ3-σN are greater than the predefined value R (steps S123-S12N are not shown in FIG. 13A).

In steps S121, S122 and steps S123-S12N not shown in the figure, if the probability function value Pi of one or more states σi out of the states σ1-σN is greater than the predefined value R, then step S132 of FIG. 13B is executed to flip the state σi. On the other hand, if the probability function value Pj of one or more states σj other than the state σi, is smaller than the predefined value R, step S134 of FIG. 13B is executed to maintain the state σj. Next, in step S136, the flipped state σi and the unchanged state σj are integrated into updated states σ1-σN.

With the above embodiments, the multiple states σ1-σN of the anneal computation may be randomly (i.e., stochastic) broadcasted in different memory arrays. In the memory arrays, local energy value Li of the corresponding state σi is calculated by the memory units of different horizontal rows or vertical columns. Accordingly, repeated calculations in the same horizontal row or vertical column of the same memory array may be avoided, so as to reduce calculation errors caused by defective memory units at specific positions in the memory array.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A memory device, for executing an anneal computation, the anneal computation has a first state and a second state, the memory device comprising:
a first memory array, comprising a plurality of memory units arranged in a plurality of vertical columns and a plurality of horizontal rows;
a second memory array, comprising a plurality of memory units arranged in a plurality of vertical columns and a plurality of horizontal rows;
a control circuit, configured to select a plurality of memory units of a first horizontal row from a first memory array, and select a plurality of memory units of a second horizontal row from a second memory array;
at least a sensing circuit, configured to calculate a local energy value of the first state according to currents generated by the memory units of the first horizontal row, and calculate a local energy value of the second state according to currents generated by the memory units of the second horizontal row; and
at least a processing circuit, configured to update the first state and/or update the second state according to the local energy value of the first state and the local energy value of the second state.

2. The memory device according to claim 1, wherein the anneal computation has a first operation period and a second operation period, the control circuit is further configured to:
in the first operation period, randomly select the memory units of the first horizontal row from the first memory array, and randomly select the memory units of the second horizontal row from the second memory array; and
in the second operation period, randomly select a plurality of memory units of a third horizontal row from the first memory array, and randomly select a plurality of memory units of a fourth horizontal row from the second memory array;
wherein, the first horizontal row is different form the third horizontal row, the second horizontal row is different form the fourth horizontal row.

3. The memory device according to claim 1, wherein the bit error rate of the first memory array is greater than the bit error rate of the second memory array, the anneal computation has a first stage and a second stage, the control circuit is further configured to:
in the first stage, randomly select a first amount of horizontal rows from the first memory array, and randomly select a second amount of horizontal rows from the second memory array, the first amount is greater than the second amount; and
in the second stage, randomly select a third amount of horizontal rows from the first memory array, and randomly select a fourth amount of horizontal rows from the second memory array, the third amount is less than the fourth amount;
wherein, the first amount is greater than the third amount, the second amount is less than the fourth amount.

4. The memory device according to claim 1, wherein each of the memory units of the first memory array and the second memory array comprising:
a first transistor, connected to an inverse word line, a inverse bit line and a source line; and
a second transistor, connected to a word line, a bit line and the source line;
wherein, the inverse word line and the word line receive voltage corresponding to the first state or the second state, the source line outputs current corresponding to the local energy value of the first state or the local energy value of the second state.

5. The memory device according to claim 4, wherein a threshold voltage of the first transistor and a threshold voltage of the second transistor are related to a mutual-coefficient and a self-coefficient of the anneal computation.

6. The memory device according to claim 5, wherein:
a logical "XNOR" computation result of the first state is multiplied with the mutual-coefficient to obtain a first product, a logical "AND" computation result of the first state is multiplied with the self-coefficient to obtain a second product, a sum of the first product and the second product is equal to the local energy value of the first state; and
a logical "XNOR" computation result of the second state is multiplied with the mutual-coefficient to obtain a third product, a logical "AND" computation result of the second state is multiplied with the self-coefficient to obtain a fourth product, a sum of the third product and the fourth product is equal to the local energy value of the second state.

7. The memory device according to claim 1, wherein the processing circuit is further configured to:
calculate a probability function value according to the local energy value of the first state and the local energy value of the second state; and
when the probability function value is greater than a predefined value, update the first state and/or update the second state.

8. The memory device according to claim 7, wherein the processing circuit is further configured to:
flip the value of the first state to update the first state; and
flip the value of the second state to update the second state.

9. The memory device according to claim 1, wherein the anneal computation further includes a third state and a fourth state, the memory device further comprises:
a third memory array; and
a fourth memory array;
wherein, the first memory array and the second memory array belong to a first group, the first group is used to calculate the local energy value of the first state and the local energy value of the second state, the third memory array and the fourth memory array belong to a second group, the second group is used to calculate the local energy value of the third state and the local energy value of the fourth state.

10. A memory device, for executing an anneal computation, the anneal computation has a first state and a second state, the memory device comprising:
a first memory array, comprising a plurality of memory units arranged in a plurality of vertical columns and a plurality of horizontal rows;
a second memory array, comprising a plurality of memory units arranged in a plurality of vertical columns and a plurality of horizontal rows;
a control circuit, configured to select a plurality of memory units of a first vertical column from a first memory array, and select a plurality of memory units of a second vertical column from a second memory array;
at least a sensing circuit, configured to calculate a local energy value of the first state according to currents generated by the memory units of the first vertical column, and calculate a local energy value of the second state according to currents generated by the memory units of the second vertical column; and at least a processing circuit, configured to update the first state and/or update the second state according to the local energy value of the first state and the local energy value of the second state.

11. The memory device according to claim 10, wherein the anneal computation has a first operation period and a second operation period, the control circuit is further configured to:
   in the first operation period, randomly select the memory units of the first vertical column from the first memory array, and randomly select the memory units of the second vertical column from the second memory array; and
   in the second operation period, randomly select a plurality of memory units of a third vertical column from the first memory array, and randomly select a plurality of memory units of a fourth vertical column from the second memory array;
   wherein, the first vertical column is different form the third vertical column, the second vertical column is different form the fourth vertical column.

12. The memory device according to claim 10, wherein each of the memory units of the first memory array and the second memory array comprising:
   a conductance element, connected to a word line and a bit line;
   wherein, the word line receives voltage corresponding to the first state or the second state, the bit line outputs current corresponding to the local energy value of the first state or the local energy value of the second state.

13. The memory device according to claim 12, wherein a conductance value of the conductance element is related to a mutual-coefficient and a self-coefficient of the anneal computation.

14. The memory device according to claim 13, wherein:
   a logical "XNOR" computation result of the first state is multiplied with the mutual-coefficient to obtain a first product, a logical "AND" computation result of the first state is multiplied with the self-coefficient to obtain a second product, a sum of the first product and the second product is equal to the local energy value of the first state; and
   a logical "XNOR" computation result of the second state is multiplied with the mutual-coefficient to obtain a third product, a logical "AND" computation result of the second state is multiplied with the self-coefficient to obtain a fourth product, a sum of the third product and the fourth product is equal to the local energy value of the second state.

15. An operating method for a memory device, wherein the memory device is for executing an anneal computation, the anneal computation has a first state and a second state, the memory device comprises a first memory array and a second memory array, the operating method comprising:
   selecting a plurality of memory units of a first horizontal row or a first vertical column from a first memory array;
   calculating a local energy value of the first state according to currents generated by the memory units of the first horizontal row or the first vertical column;
   selecting a plurality of memory units of a second horizontal row or a second vertical column from a second memory array;
   calculating a local energy value of the second state according to currents generated by the memory units of the second horizontal row or the second vertical column; and
   updating the first state and/or updating the second state according to the local energy value of the first state and the local energy value of the second state.

16. The operating method according to claim 15, wherein the anneal computation has a first operation period, the operating method comprising:
   in the first operation period, randomly selecting the memory units of the first horizontal row or the first vertical column from the first memory array, and randomly selecting the memory units of the second horizontal row or the second vertical column from the second memory array.

17. The operating method according to claim 16, wherein the anneal computation further has a second operation period, the operating method comprising:
   in the second operation period, randomly selecting the memory units of the third horizontal row or the third vertical column from the second memory array, and randomly selecting the memory units of the fourth horizontal row or the fourth vertical column from the second memory array;
   wherein, the first horizontal row is different form the third horizontal row, the first vertical column is different form the third vertical column, the second horizontal row is different form the fourth horizontal row, the second vertical column is different form the fourth vertical column.

18. The operating method according to claim 15, wherein each of the memory units of the first memory array and the second memory array comprises a first transistor and a second transistor, a threshold voltage of the first transistor and a threshold voltage of the second transistor are related to a mutual-coefficient and a self-coefficient of the anneal computation, the operating method further comprising:
   multiplying a logical "XNOR" computation result of the first state with the mutual-coefficient to obtain a first product;
   multiplying a logical "AND" computation result of the first state with the self-coefficient to obtain a second product;
   summing the first product and the second product to obtain the local energy value of the first state;
   multiplying a logical "XNOR" computation result of the second state with the mutual-coefficient to obtain a third product;
   multiplying a logical "AND" computation result of the second state with the self-coefficient to obtain a fourth product; and
   summing the third product and the fourth product to obtain the local energy value of the second state.

19. The operating method according to claim 15, wherein each of the memory units of the first memory array and the second memory array comprises a conductance element, a conductance value of the conductance element is related to a mutual-coefficient and a self-coefficient of the anneal computation, the operating method further comprising:
   multiplying a logical "XNOR" computation result of the first state with the mutual-coefficient to obtain a first product;
   multiplying a logical "AND" computation result of the first state with the self-coefficient to obtain a second product;
   summing the first product and the second product to obtain the local energy value of the first state;
   multiplying a logical "XNOR" computation result of the second state with the mutual-coefficient to obtain a third product;

multiplying a logical "AND" computation result of the second state with the self-coefficient to obtain a fourth product; and summing the third product and the fourth product to obtain the local energy value of the second state.

20. The operating method according to claim 15, further comprising:

calculating a probability function value according to the local energy value of the first state and the local energy value of the second state; and when the probability function value is greater than a predefined value, flipping the value of the first state to update the first state and/or flipping the value of the second state to update the second state.

* * * * *